(12) United States Patent
Wang

(10) Patent No.: US 10,886,922 B2
(45) Date of Patent: Jan. 5, 2021

(54) TEST CIRCUITRY AND TECHNIQUES FOR LOGIC TILES OF FPGA

(71) Applicant: Flex Logix Technologies, Inc., Mountain View, CA (US)

(72) Inventor: Cheng C. Wang, San Jose, CA (US)

(73) Assignee: Flex Logix Technologies, Inc., Mountain View, CA (US)

(*) Notice: Subject to any disclaimer, the term of this patent is extended or adjusted under 35 U.S.C. 154(b) by 0 days.

(21) Appl. No.: 16/718,619

(22) Filed: Dec. 18, 2019

(65) Prior Publication Data

US 2020/0127666 A1 Apr. 23, 2020

Related U.S. Application Data

(62) Division of application No. 16/186,882, filed on Nov. 12, 2018, now Pat. No. 10,523,209.

(60) Provisional application No. 62/585,677, filed on Nov. 14, 2017.

(51) Int. Cl.
*H03K 19/17728* (2020.01)
*G01R 31/3177* (2006.01)
*H03K 19/173* (2006.01)

(52) U.S. Cl.
CPC ... *H03K 19/17728* (2013.01); *G01R 31/3177* (2013.01); *H03K 19/1737* (2013.01)

(58) Field of Classification Search
CPC ......... H03K 19/17728; H03K 19/1737; G01R 31/3177
See application file for complete search history.

(56) References Cited

U.S. PATENT DOCUMENTS

| | | | |
|---|---|---|---|
| 6,798,239 B2 | 9/2004 | Douglass et al. | |
| 6,857,092 B1 | 2/2005 | Fox | |
| 6,996,758 B1 | 2/2006 | Herron et al. | |
| 7,409,610 B1* | 8/2008 | Drimer | G01R 31/318544 326/39 |
| 8,627,159 B2 | 1/2014 | Policke et al. | |
| 10,523,209 B1 | 12/2019 | Wang | |
| 2004/0015758 A1* | 1/2004 | Pathak | G11C 29/02 714/725 |
| 2006/0255833 A1* | 11/2006 | Singh | H03K 19/17736 326/41 |

* cited by examiner

*Primary Examiner* — Daniel D Chang
(74) *Attorney, Agent, or Firm* — Neil A. Steinberg

(57) ABSTRACT

An integrated circuit comprising a field programmable gate array including a plurality of logic tiles, wherein, during operation, each logic tile is configurable to connect with at least one other logic tile, and wherein each logic tile includes: (1) a normal operating mode and test mode, (2) an interconnect network including a plurality of multiplexers, wherein during operation, the interconnect network of each logic tile is configurable to connect with the interconnect network of at least one other logic tile in the normal operating mode and (3) bitcells to store data. The FPGA also includes control circuitry, electrically connected to each logic tile, to configure each logic tile in a test mode and enable concurrently writing configuration test data into each logic tile of the plurality of logic tiles when the FPGA is in the test mode.

24 Claims, 37 Drawing Sheets

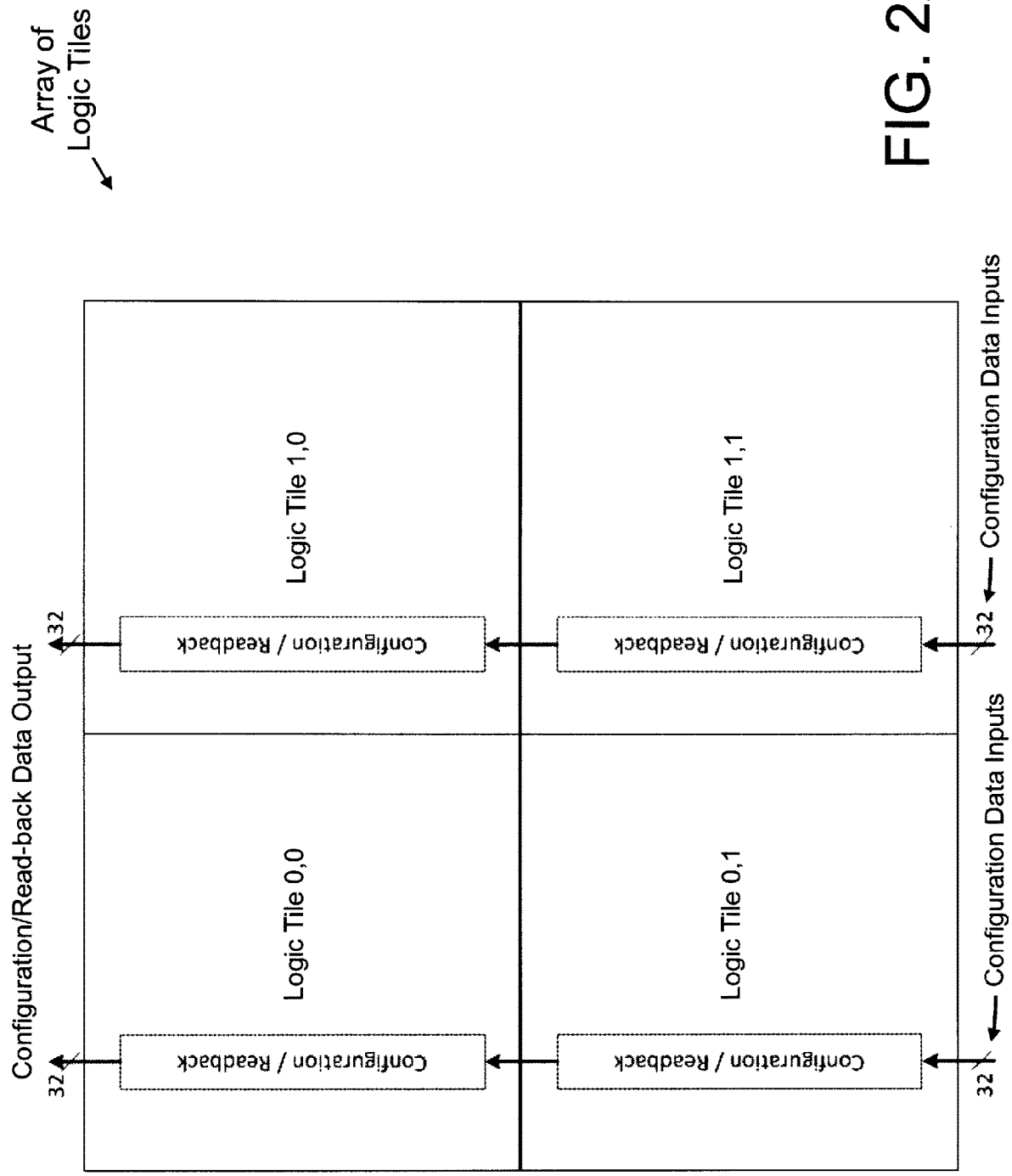

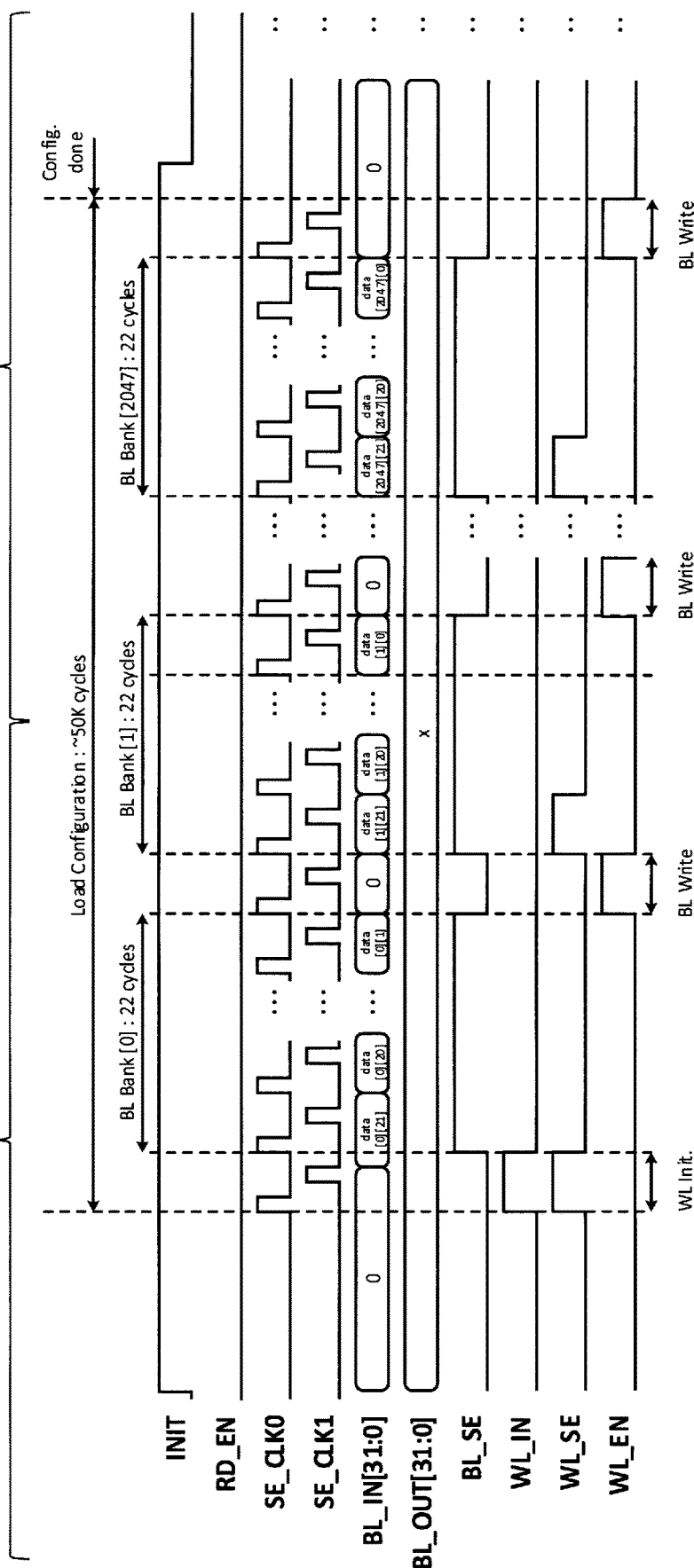

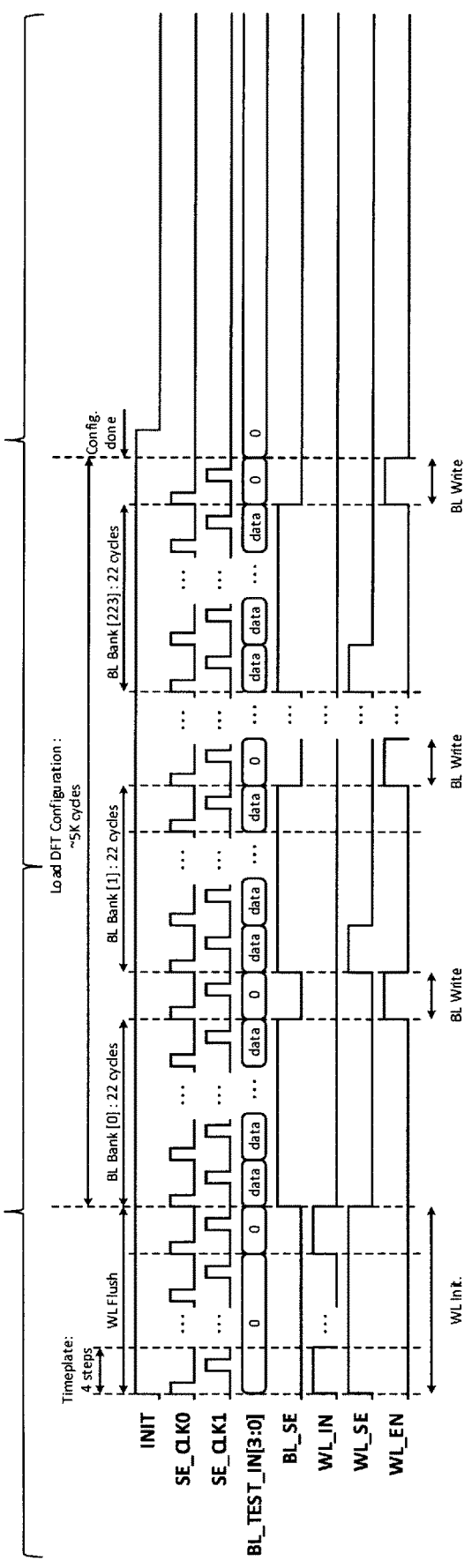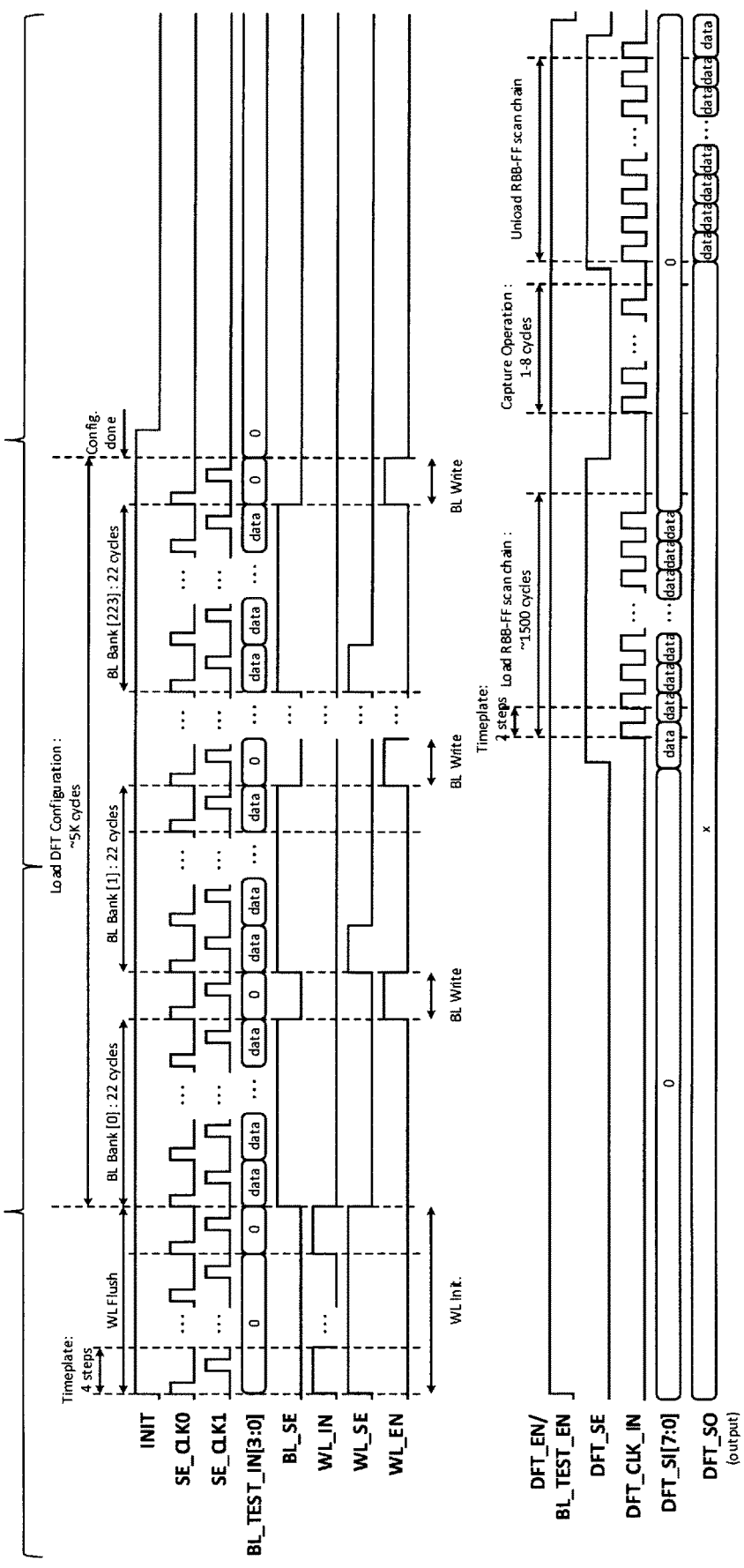

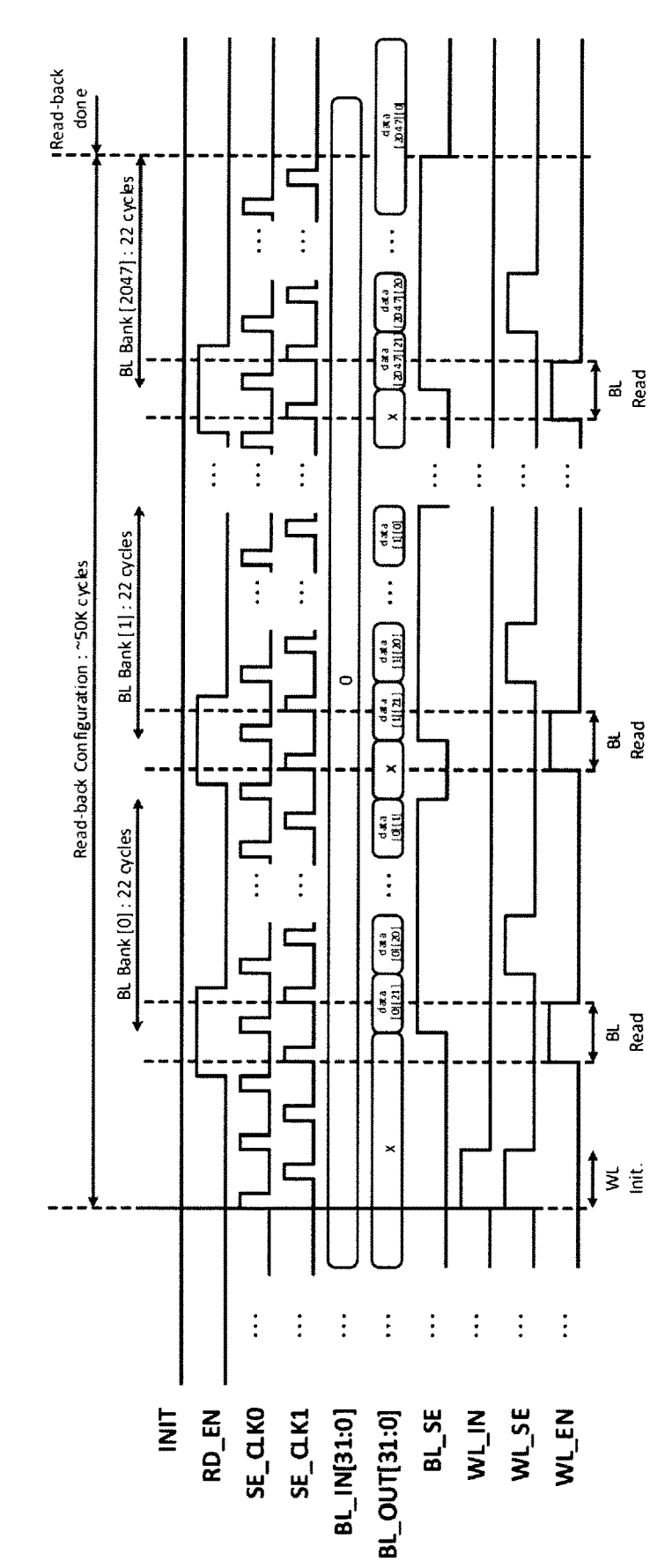

```
// Test Procedure for RBB Scan-FF scan chain
set time scale 1 ns;

// Define the strobe time for the measure statements
set strobe_window time 1;

timeplate tp_CLK =
    force_pi 0;
    measure_po 1;
    pulse DFT_CLK_IN 2 1;
    period 4;
end;

procedure shift =
    timeplate tp_CLK;
    cycle =
       force_sci;
       measure_sco;
       pulse DFT_CLK_IN;
    end;
end;

procedure load_unload =
    timeplate tp_CLK;
    cycle =
       force DFT_SE    1;
       force INIT      1;
       force CHIP_RST  0;
    end;
    apply shift 1271;
end;
```

FIG. 13A

```
// Test Procedure for configuration scan chain
set time scale 1 ns;

// Define the strobe time for the measure statements
set strobe_window time 1;

timeplate tp_BLWL_SE =
    force_pi 0;
    measure_po 1;
    pulse SE_CLK0 1 1;
    pulse SE_CLK1 3 1;
    period 4;     // 4-phase non-overlapping clock
end;

procedure shift =
    timeplate tp_BLWL_SE;
    cycle =
      force INIT  1;
      force BL_SE 1; // advance BL for 1 cycle
      force WL_SE 0;
      force WL_EN 0;
      force WL_IN 0;
      force_sci;
      measure_sco;
      pulse SE_CLK0 ;
      pulse SE_CLK1 ;
    end;
end;

procedure shadow_control =
    timeplate tp_BLWL_SE;
    cycle =
      force INIT  1;
      force BL_SE 0;
      force WL_EN 1; // write WL_EN for 1 cycle
      force WL_SE 0;
      force WL_IN 0;
      pulse SE_CLK0 ;
      pulse SE_CLK1 ;
    end;
end;

procedure load_unload = // load bitstream during scan
    timeplate tp_BLWL_SE;
    cycle =
      force INIT    1;
      force SE_CLK0 0;
      force SE_CLK1 0;
      force BL_SE   1;
      force WL_SE   0;
      force WL_IN   0;
      force WL_EN   0;
    end;

apply shift 88 ; // 4channel * 22b per channel
    apply shadow_control 1;
end;
```

FIG. 13B

TEST CIRCUITRY AND TECHNIQUES FOR LOGIC TILES OF FPGA

RELATED APPLICATION

This application is a divisional of U.S. Non-Provisional application Ser. No. 16/186,882, filed Nov. 12, 2018 (still pending). This application and the '882 application claim priority to and the benefit of U.S. Provisional Application No. 62/585,677, entitled "Test Circuitry and Techniques for Logic Tiles of FPGA", filed Nov. 14, 2017. The '677 provisional application is hereby incorporated herein by reference in its entirety.

STATEMENT OF U.S. GOVERNMENT RIGHTS

This invention was made with Government support under Agreement No. HR0011-17-9-0002, awarded by DARPA. The Government has certain rights in the invention.

INTRODUCTION

There are many inventions described and illustrated herein. In one aspect, the present inventions are directed to circuitry and techniques for testing, in parallel, a plurality of logic tiles of an integrated circuit. The logic tiles may be a field programmable gate array (FPGA, e.g., an embedded FPGA) disposed in or on the integrated circuit wherein the FPGA includes programmable/configurable logic circuitry having a plurality of tiles (e.g., arranged in an array of row(s) and column(s)) wherein one or more (or all) tiles includes programmable components ("tiles" are often called "configurable logic blocks" (CLB), "logic array blocks" (LAB), or "logic tiles"—hereinafter collectively "logic tiles").

In addition thereto, or in lieu thereof, in another aspect, the present inventions are directed to circuitry and techniques for writing or loading, in parallel, configuration data (e.g., test mode configuration data) into a plurality of logic tiles of an integrated circuit to test the functionality and/or operability of the circuitry in/of each of the logic tiles. In one embodiment, the testing of circuitry of the logic tiles may be implemented in parallel wherein circuitry of each of a plurality of or all logic tiles are tested or undergo one or more test sequences concurrently (i.e., at the same time) in a test process/sequence of the programmable/configurable logic circuitry. Alternatively, such testing of circuitry of the plurality of logic tiles may be implemented serially wherein the circuitry of each logic tile or each group of logic tiles of the programmable/configurable logic circuitry are tested or undergo one or more test sequences at different times in the test process/sequence (e.g., separately and/or sequentially from the other logic tiles and/or groups of logic tiles of the programmable/configurable logic circuitry). Notably, the present inventions may implement any test sequence/process and/or test data/test mode configuration data now known or later developed; all of which are intended to fall within the scope of the present inventions.

In one embodiment, circuitry of the logic tiles may be "isolated" or electrically disconnected from circuitry of other logic tiles (e.g., circuitry of adjacent logic tiles) and/or circuitry external to the programmable/configurable logic circuitry. Here, the circuitry of a logic tile under test is electrically "isolated" from circuitry connected thereto during normal or typical operation in order to isolate and more readily determine whether circuitry of the logic tile under test is inoperative, faulty, non-functional and/or unreliable. In test mode, selected interconnects and/or inputs/outputs of the logic tile may be communicatively and/or electrically "disconnected" or "disabled" from the associated interconnects, circuitry and/or input/output of other logic tiles or external circuitry connected thereto.

For example, the interconnect network or circuitry of the interconnect network of a logic tile may be tested in isolation whereby such circuitry is effectively disconnected from interconnect network(s) of other logic tiles. In this way, one or more test sequences may be implemented with respect to the circuitry of the interconnect network of a logic tile and the results thereof more readily determine or characterize the integrity, operability and/or reliability of the circuitry of the logic tile(s) under test. In one embodiment, isolation circuitry may be employed to disconnect or disable selected interconnects of one or more stages of the interconnect network from stages of one or more associated interconnect network of other logic tile(s) (e.g., adjacent logic tile(s)) of the programmable/configurable logic circuitry. For example, the output(s) of interconnects of one or more stages of the interconnect network of the logic tile under test or undergoing a test sequence that connect to an associated interconnect network of other logic tile(s) during normal operation are looped back into the interconnect network of such logic tile during performance of a test sequence/process of the logic tile (e.g., a test sequence pertaining to the interconnect network). Any other I/Os that connects between two or more (or all) logic tiles in functional or normal mode maybe disconnected and looped back in the same or a similar manner to the interconnect network and RBB I/O logic described herein. In this way, the impact of the operability or functionality of circuitry of other logic tile(s) (e.g., adjacent logic tile(s)) is managed, limited and/or eliminated relative to the testing of circuitry of the logic tile under test.

Notably, the isolation circuitry may be employed in the test mode and in a non-test mode (i.e., during normal operation) in order to disconnect certain circuitry from circuitry of other logic tiles to which is it typically connected during normal operation (i.e., when the logic tile is programmed with normal configuration data for a normal configuration). That is, the isolation circuitry may be enabled when a logic tile is in a functional or normal mode wherein, the interconnect network (circuitry associated with the interconnect network), of a logic tile for example, may be isolated or disconnected from the interconnect network(s) of one or more (or all) of the other logic tiles (e.g., one or more (or all) of the neighboring or adjacent logic tiles).

In one embodiment, test mode control circuitry (which, for example, is disposed in/on the integrated circuit) may be employed to program or configure circuitry (e.g., multiplexers), input/output (I/O) and/or the switch interconnect network of the logic tile(s) to program and/or configure one or more (or all) logic tiles into a test mode or test mode configuration. For example, the test mode control circuitry may issue one or more control signals to circuitry of the logic tiles to, for example, implement or enable (i) writing or loading of test mode configuration data to or into a plurality (or all) of the logic tiles in parallel or sequentially, and/or (ii) testing of circuitry in a plurality (or all) of the logic tiles in parallel or sequentially (e.g., using the test mode configuration data), and/or (iii) isolation circuitry in one or more (or all) of the logic tiles to disconnect circuitry of a logic tile from circuitry of other logic tiles (e.g., circuitry of adjacent logic tile(s) that is connected during normal operation) when testing of circuitry of the logic tile at issue (i.e., under test).

Moreover, the test mode control circuitry may also enable or facilitate read-back of the test data/configuration after one or more logic tiles are programmed, configured or written with test data (e.g., prior to or after implementation of the test sequence). The read-back operation may be employed to verify a test mode configuration(s) and/or test data written to or loaded into such logic tile(s). In addition thereto, or in lieu thereof, the read-back operation may access the data of test results in order to assess the integrity, operability or functionality of the circuitry under test (e.g., in each of the logic tiles). In one embodiment, the read-back operation may employ the configuration port to read the test data/configuration previously written into the logic tile(s)—for example, via parallel writing or loading of test mode configuration data to or into a plurality (or all) of the logic tiles of the programmable/configurable logic circuitry.

Notably, the test mode control circuitry may program or configure one or more (or all) logic tiles during a test sequence which may be performed when the IC is engaged or connected to IC test equipment/tools and/or, for example, at initialization or at start-up of the integrated circuit and/or FPGA.

Briefly, an exemplary FPGA includes control circuitry, timing or clock circuitry, power supply circuitry and programmable/configurable logic circuitry. (See, FIG. 1A). Each logic tile of the array or plurality of logic tiles of the programmable/configurable logic circuitry includes logic transistors (that may be interconnected, for example, as multiplexers having two or more inputs which are electrically interconnected into a network as well as connected to, for example, associated data storage elements, input pins and/or look-up tables (LUTs) that, when programmed, determine the operation of the multiplexers).

The plurality of logic tiles of an exemplary embodiment of programmable/configurable logic circuitry, for example, of an FPGA, includes input/output of the logic tiles which facilitates communication between the logic tiles and/or between one or more logic tiles and circuitry external to the programmable/configurable logic circuitry. (See, FIG. 1B). For example, in one embodiment, each logic tile may include Logic-Memory and/or DSP cores and contain more than a thousand LUTs (e.g., 6-input LUTs) from hundreds of Reconfigurable Building Blocks (RBBs), including Kb RAM, and hundreds of I/O blocks (e.g., 2-input, 2-output each). As noted above, the logic tiles may be "tiled" to form an array from the LUTs and from the DSP multiply and accumulate blocks (MACs).

An FPGA may be configured and/or reconfigured (hereinafter, unless stated otherwise, collectively "configured" or the like (e.g., "configure", "configuring" and "configurable")) by a user, customer and/or a designer before and/or after manufacture. The FPGA includes, among other things, a plurality of logic tiles wherein each logic tile includes a logic tile interconnect network of configurable interconnects that facilitate communication within the logic tile. (See, e.g., FIGS. 1A and 1B). One or more (or all) of the logic tiles include a plurality of multiplexers which are electrically interconnected into a network (for example, a hierarchical network and/or mesh network).

In addition, the FPGA includes tile-to-tile interconnects that interconnect the logic tile interconnect network of each logic tile thereby providing communication between the logic tiles. (See, e.g., FIG. 1C). (See, Provisional Patent Application No. 62/735,988 (which is incorporated herein by reference). The logic tile interconnect network of each logic tile may include a plurality of switch matrices (e.g., an M×N switch matrix) arranged in a plurality of switch matrix stages or switch matrices stages which are interconnected into a logic tile interconnect network via logic tile interconnects. (See, for example, FIG. 1D—see also, for example, the interconnect networks described and/or illustrated in U.S. Pat. No. 9,503,092, which are incorporated herein by reference). As such, logic tiles are configurable to communicate, during operation of the integrated circuit, between computing elements within the logic tile as well as with at least one other logic tile of the FPGA.

With reference to FIGS. 1C and 1D, in one embodiment, the tile-to-tile interconnects of the mesh-type tile-to-tile interconnect network connect the highest stage of the logic tile interconnect network of each logic tile. In another embodiment, the tile-to-tile interconnects of the mesh-type tile-to-tile interconnect network connect an intermediate stage of the logic tile interconnect network of each logic tile. Indeed, in one embodiment, the tile-to-tile interconnects of the mesh-type tile-to-tile interconnect network may directly interconnect a plurality of stages of the logic tile interconnect network wherein the tile-to-tile interconnects directly connect to a plurality of stages of each logic tile interconnect network of logic tiles—thereby directly interconnecting two or more stages of logic tile interconnect network of each logic tile wherein each stage is directly connected into a separate and distinct mesh-type tile-to-tile interconnect network.

Notably, the integrated circuit may be, for example, a processor, controller, state machine, gate array, system-on-chip (SOC), programmable gate array (PGA) and/or FPGA.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

BRIEF DESCRIPTION OF THE DRAWINGS

The present inventions may be implemented in connection with embodiments illustrated in the attached drawings. These drawings show different aspects of the present inventions and, where appropriate, reference numerals or names identifying or illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIG. 2A illustrates a block diagram representation of a plurality of logic tiles (e.g., arranged in an array of rows and columns—here, 2×2 array of logic tiles—albeit the logic tile array (consisting of a plurality of logic tiles) may be any size (e.g., N×M)); in this exemplary embodiment, each logic tile includes configuration data inputs to receive configuration data, configuration data outputs and configuration circuitry connected therebetween; here the configuration data is written into the logic tile via the configuration data inputs for use in the test sequences or the functional/normal mode; notably, the configuration outputs of a tile (e.g., Logic Tile 0,1 and Logic Tile 1,1) may be connect to the configuration data inputs of another logic tile (e.g., Logic Tile 0,0 and Logic Tile 1,0, respectively—adjacent logic tiles in this illustrative embodiment) wherein the configuration data may be written into each row or column of the plurality of the logic tiles serially (in this illustrative embodiment, each row), therefore allow each tile to receive a unique set of configuration data (either for test mode, or functional/normal mode); as noted above, the logic tiles may also include circuitry to facilitate read-back of the configuration test data after one or more logic tiles are programmed, configured or written with test data (prior to or after implementation of the test sequence); here, in response to a read-back operation, the test mode configuration(s) and test data written to or loaded into such logic tile(s) may be read-back to, for example, verify the accuracy of the written data; in this embodiment, the read-back operation employs the configuration port to read the configuration test data previously written into the logic tile(s)—for example, via serial writing or loading of test mode configuration data to or into each row of the plurality of the logic tiles;

FIG. 4A illustrates an exemplary timing diagram for the functional configuration of a core of a logic tile (e.g., the exemplary architecture of FIG. 3A); notably, the configuration data is written into a logic tile via the configuration data inputs (labeled here as BL_IN) for use during normal/functional operation; moreover, certain of the information identified on the exemplary timing diagrams (e.g., number of cycles and amount of time) are merely exemplary and pertinent to certain particulars of the exemplary architecture of FIG. 3A (e.g., bus width and layout as well as bitcell density and layout); such information is not intended to be limiting, in any way, to the scope of the present inventions;

FIG. 6A illustrates an exemplary timing diagram for the test mode configuration of a core of a logic tile (e.g., the exemplary architecture of FIG. 5A), according to certain aspects of the present inventions; notably, the configuration test data is written into a logic tile via the configuration data inputs (labeled here as BL_IN) for use in the test sequences; moreover, certain of the information identified on the exemplary timing diagrams (e.g., number of cycles and amount of time) are merely exemplary and pertinent to certain particulars of the exemplary architecture of FIG. 5A (e.g., bus width and layout as well as bitcell density and layout); such information is not intended to be limiting, in any way, to the scope of the present inventions;

FIG. 10A illustrates an exemplary timing diagram of FIG. 8 for the read-back operation of a core of a logic tile (e.g., the exemplary architecture of FIG. 7A), according to certain aspects of the present inventions; notably, the data read from the logic tile via the configuration data outputs (labeled "BL_OUT") during a read-back operation; again, certain of the information identified on the exemplary timing diagrams (e.g., number of cycles and amount of time) are merely exemplary and pertinent to certain particulars of the exemplary architecture of FIG. 7A (e.g., bus width and layout as well as bitcell density and layout); such information is not intended to limiting, in any way, to the scope of the present inventions;

FIGS. 13A and 13B sets forth exemplary code (suitable for implementation on the Mentor Graphics Tessent test tool/equipment) of the test processes/sequences or test modes for the RBB scan-FF scan chain and the configuration scan chain for a logic tile of the FPGA implementing one or more of the architectures illustrates and described herein, according to certain aspects of the present inventions; notably, this code is merely exemplary and not limiting in that other code to perform the methods and processes described herein; moreover, test tools/equipment other than Mentor Graphics may be employed to perform one or more of the operations/methods described and/or illustrated herein.

Figure 1A:
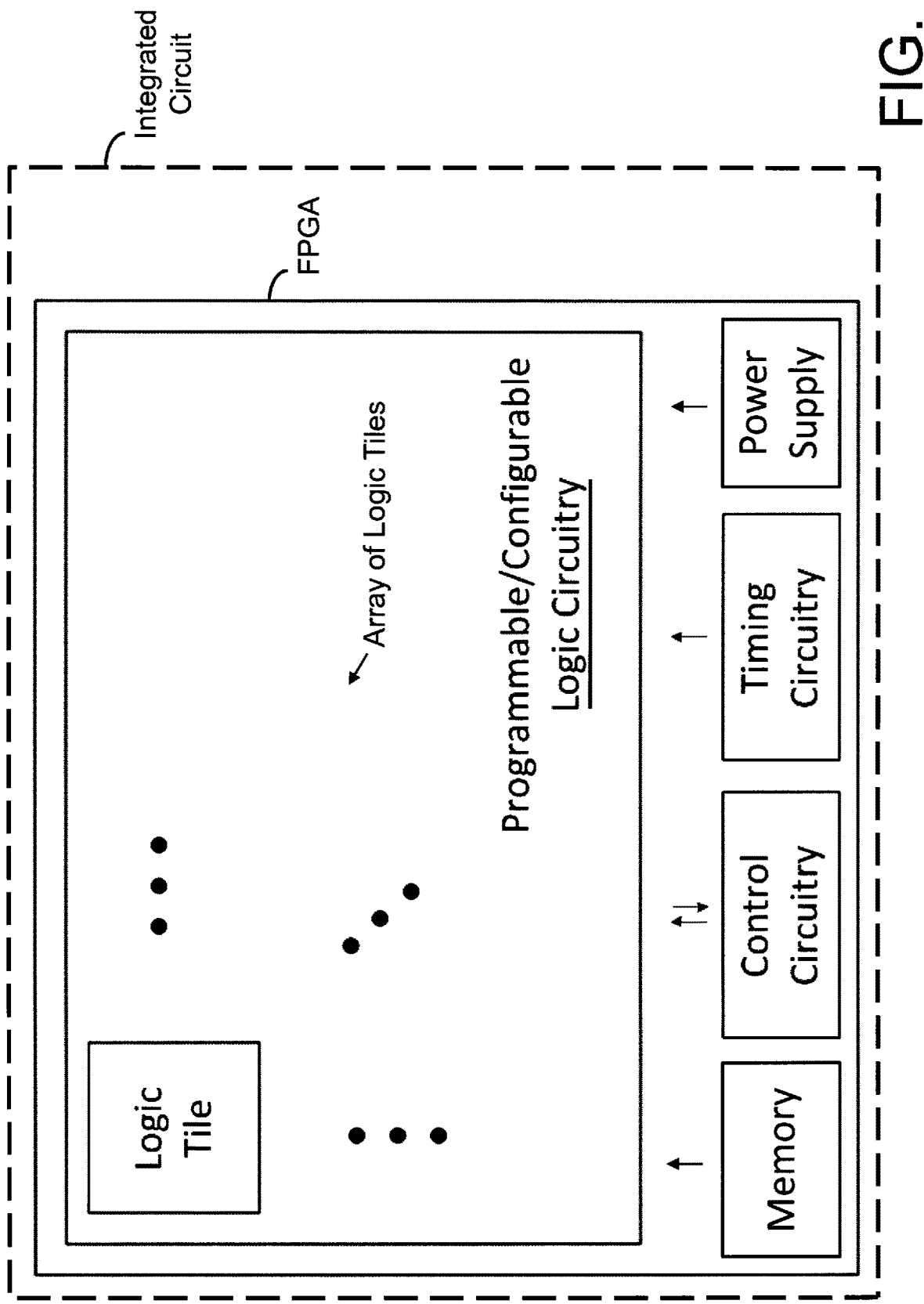
FIG. 1A illustrates a block diagram representation of, for example, an exemplary integrated circuit including control circuitry, timing or clock circuitry, power supply circuitry and programmable/configurable logic circuitry (which includes a plurality of logic tiles, each of which may include transistors configured to perform combinational and/or sequential functions (simple and/or complex) and transistors (that may be interconnected, for example, as multiplexers having two or more inputs which are electrically interconnected into a network (see, for example, the interconnect networks described and/or illustrated in U.S. Pat. No. 9,503,092 and U.S. Provisional Patent Application No. 62/735,988; the '092 patent and '988 application are incorporated herein by reference) as well as connected to, for example, associated data storage elements, input pins and/or lookup tables that, when programmed, determine the operation and connectivity of the multiplexers))
Figure 1B:
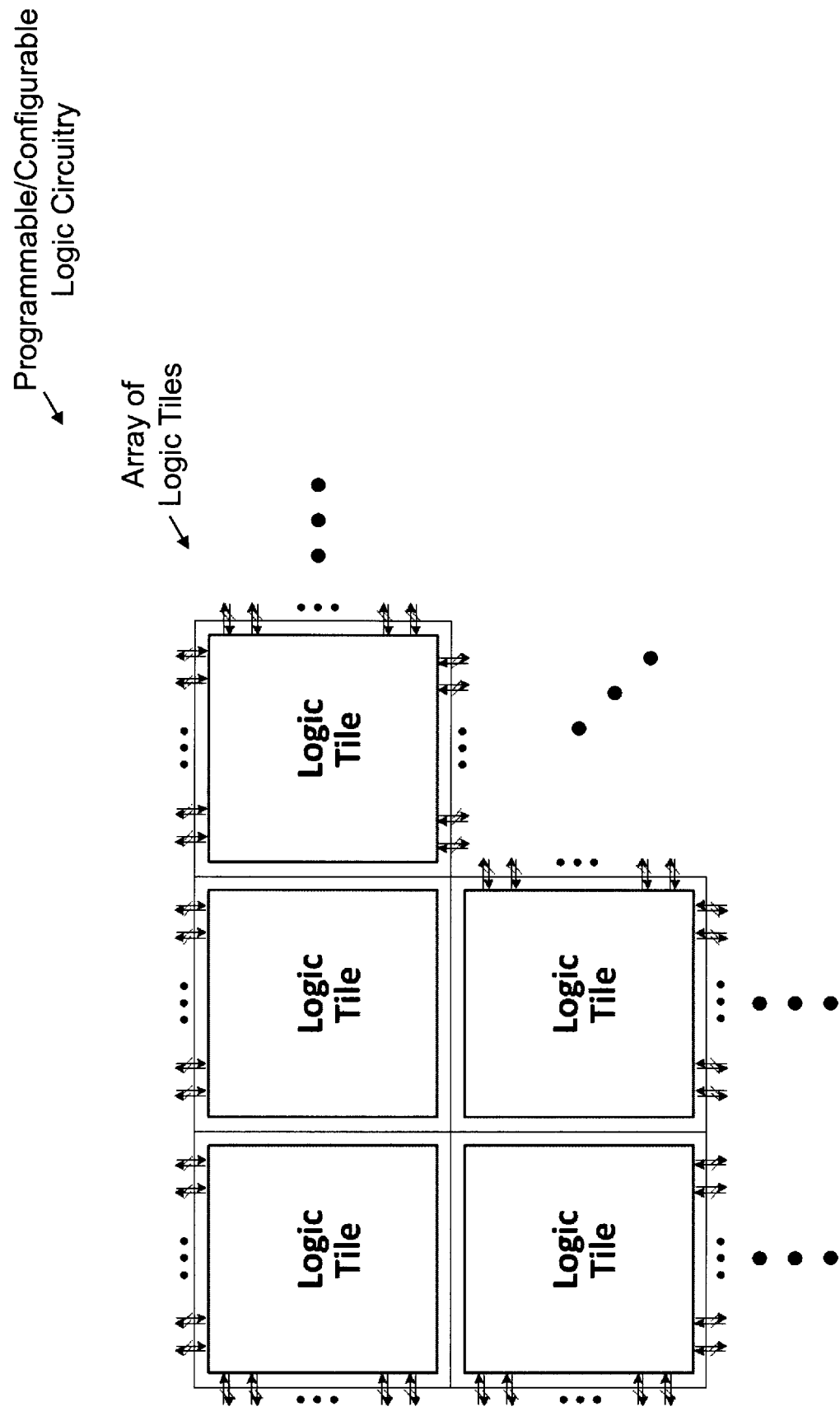
FIG. 1B illustrates, among other things, a block diagram representation of a plurality of logic tiles (arranged in an array) of, for example, an exemplary FPGA, wherein input/output of the logic tiles may facilitate communication between the logic tiles and/or between certain logic tiles and circuitry external to the programmable/configurable logic circuitry; notably, the programmable/configurable logic circuitry may be comprised of a plurality of programmable logic tiles wherein each logic tile includes a plurality of multiplexers which are electrically interconnected into a network (e.g., a hierarchical network and/or mesh network); notably, the terms multiplexers and switches are used herein interchangeably even though a switch may consist of a plurality of multiplexers.
Figure 1C:
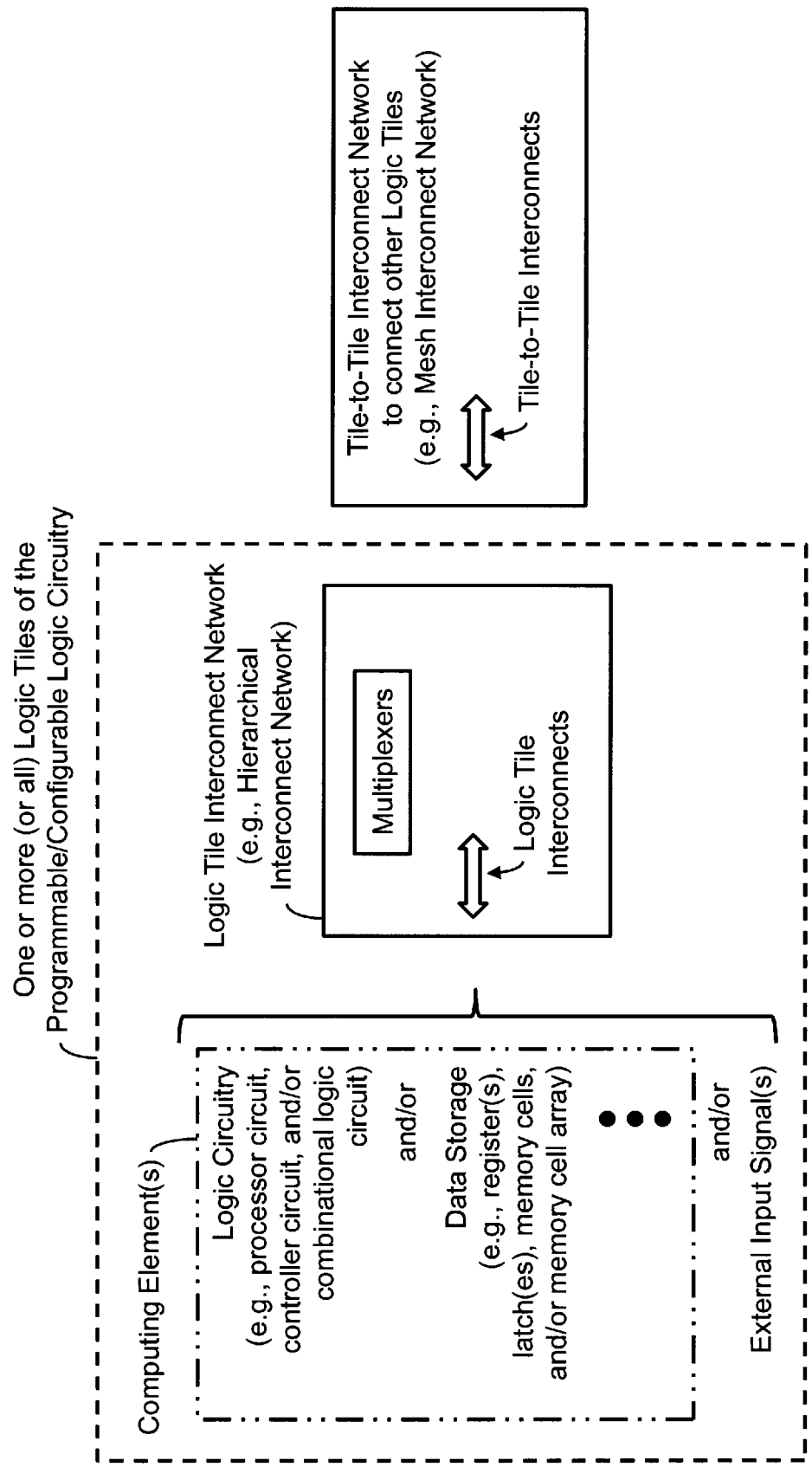
FIG. 1C illustrates a block diagram representation of the interconnect architecture of one or more (or all) of the logic tiles of the programmable/configurable logic circuitry which include computing elements interconnected via a logic tile interconnect network (e.g., a hierarchical interconnect network or a mixed-mode interconnect network) wherein a plurality (or all) logic tiles are interconnected via a tile-to-tile interconnect network (e.g., a mesh interconnect network wherein a plurality of switches of a stage of the logic tile interconnect network (e.g., the highest stage) are connected (via tile-to-tile interconnects) to a plurality of switches of a stage logic tile interconnect network (e.g., the highest stage) of one or more other logic tiles; notably, the tile-to-tile interconnects and/or logic tile interconnects may include uni-directional conductors and/or one bi-directional conductors.
Figure 1D:
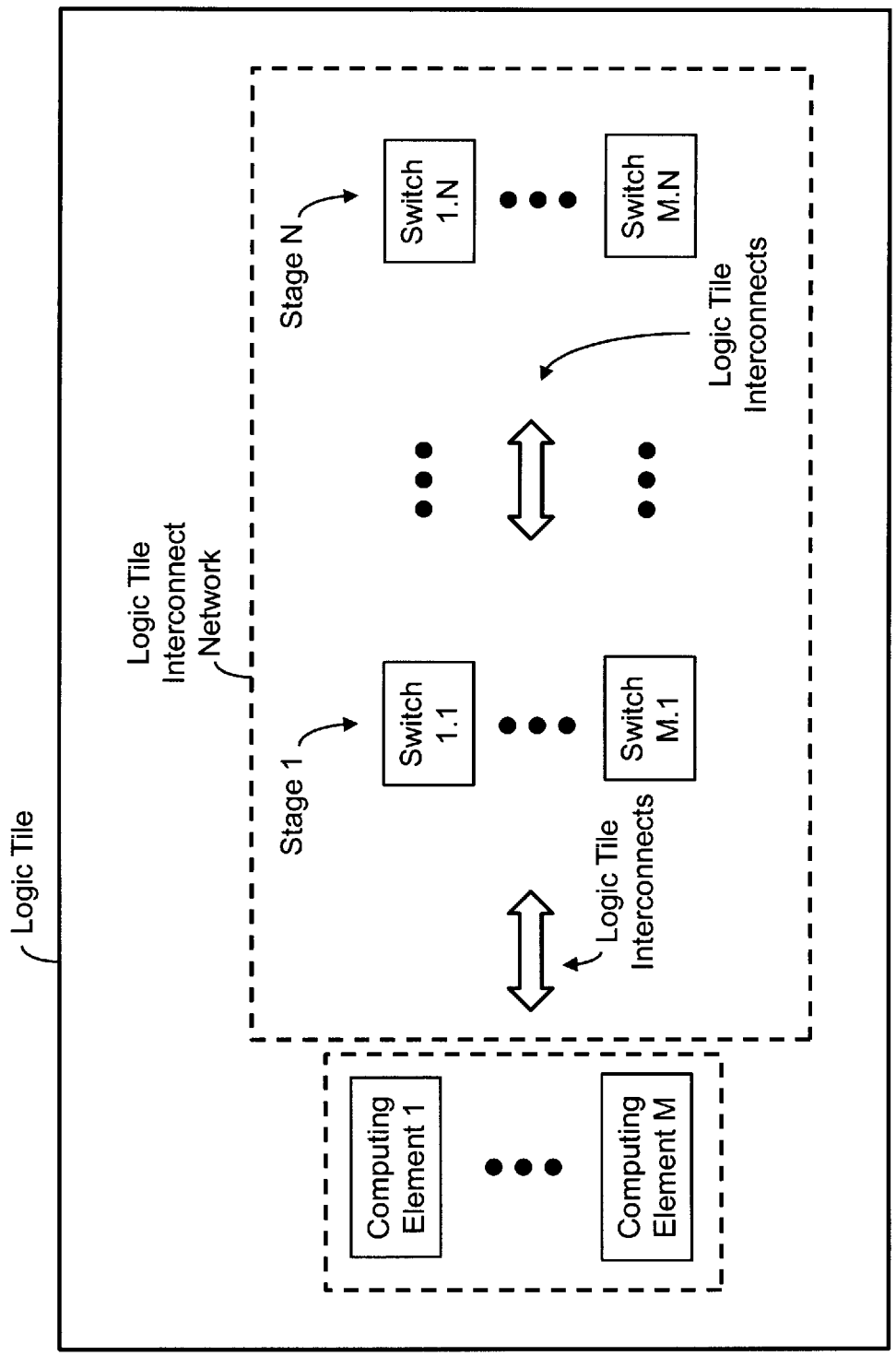
FIG. 1D illustrates a block diagram representation of an M×N array of switch matrices, without detailed illustration of interconnection, of an exemplary logic tile of the programmable/configurable logic circuitry of an FPGA; notably, any interconnect network now known or later developed may be implemented in the logic tiles (e.g., hierarchical network and/or mesh network)—all of which may be employed in connection with the present inventions.

Again, there are many inventions described and illustrated herein. An embodiment or implementation described herein as "exemplary" is not to be construed as ideal, preferred or advantageous, relative to other embodiments or implementations; rather, it is intended reflect or indicate the embodiment(s) is/are "example" or "illustrative" embodiment(s). Indeed, these inventions are neither limited to any single aspect nor embodiment thereof, nor to any combinations and/or permutations of such aspects and/or embodiments. Each of the aspects of the present inventions, and/or embodiments thereof, may be employed separately/alone or in combination with one or more of the other aspects of the present inventions and/or embodiments thereof. For the sake of brevity, many of those combinations/permutations are not discussed or illustrated separately herein.

DETAILED DESCRIPTION

The present inventions are directed to circuitry and techniques to test a plurality of logic tiles of programmable/configurable logic circuitry of, for example, an FPGA (e.g., an embedded FPGA (e.g., embedded in a processor or ASIC)). In a first aspect, the test configuration data is currently (i.e., in parallel) loaded or written into a plurality of logic tiles (e.g., all of the logic tiles of a logic tile array). Here, test configuration data is provided (e.g., currently) to a plurality of logic tiles of the programmable/configurable logic circuitry and concurrently written into one or more bitcells in a plurality of the logic tiles. Thereafter, the circuitry in the logic tiles (e.g., all of the logic tiles of the programmable/configurable logic circuitry) may be tested or undergo one or more test sequences to determine, assess and/or characterize the functionality and/or operability of the circuitry in/of each of the logic tiles.

In a second aspect, the present inventions are directed to circuitry and techniques for testing, in parallel, a plurality of logic tiles (e.g., all of the logic tiles of the programmable/configurable logic circuitry). Here, one or more test sequences are performed on circuitry in each logic tile or each group of logic tiles concurrently in the test process/sequence of the programmable/configurable logic circuitry. Notably, the present inventions may implement any test sequence/process and/or test data/test mode configuration data now known or later developed; all of which are intended to fall within the scope of the present inventions.

In addition thereto, or in lieu thereof, in another aspect, the present inventions are directed to circuitry and techniques to "isolate" circuitry of a logic tile during test (e.g., the interconnect network and/or I/O circuitry). Here, the circuitry of a logic tile, which is typically connected to one or more logic tiles and/or circuitry external to the array of logic tiles during normal operation, may be responsively disconnected from such one or more other logic tiles (e.g., the network of one or more adjacent logic tiles). In one embodiment, tile-to-tile interconnects and/or inputs/outputs of the logic tile may be communicatively and/or electrically "disconnected" or "disabled" from the associated interconnects, circuitry and/or input/output of other logic tiles or external circuitry connected thereto. When, for example, the interconnect network of a logic tile under test is electrically "isolated" from interconnect network(s) of other logic tile(s) (to which such interconnect network is connected to during normal or typical operation) during a test mode, the results or outcome of implementing a test sequence may be more readily determinative of whether interconnect network and associated circuitry of the logic tile under test is functional, operative and/or reliable.

For example, the interconnect network and/or associated circuitry of a logic tile may be tested in isolation whereby such network/circuitry is effectively disconnected from interconnect network(s) of other logic tiles thereby permitting one or more test sequences to be implemented on circuitry of the interconnect network of the logic tile at issue to more readily determine or characterize, separate from other logic tile(s) (e.g., adjacent logic tile(s)), the integrity, operability and/or reliability of the circuitry of the logic tile(s) under test. In one embodiment, isolation circuitry may be employed to disconnect or disable selected interconnects of one or more stages of the interconnect network from stages of one or more associated interconnect network of other logic tile(s) (e.g., adjacent logic tile(s)) of the programmable/configurable logic circuitry. For example, output(s) interconnects of one or more stages of the interconnect network of the logic tile under test or undergoing a test sequence that are connected, during normal operation, to an associated interconnect network(s) of other logic tile(s) are looped back into the interconnect network during performance of a test sequence/process (e.g., a test sequence pertaining to the interconnect network). Any other I/Os that connects between two or more (or all) logic tiles in functional or normal mode maybe disconnected and looped back in the same or a similar manner to the interconnect network and RBB I/O Logic described herein. In this way, the impact of the operability or functionality of circuitry of other logic tile(s) (e.g., adjacent logic tile(s)) is limited and/or eliminated relative to the testing of circuitry of the logic tile under test.

Test mode control circuitry (which, for example, is disposed in/on the integrated circuit) may be employed to program or configure circuitry (e.g., multiplexers), input/output (I/O) and/or the switch interconnect network of the logic tile(s) to program and/or configure one or more (or all) logic tiles in a test mode or test mode configuration prior to implementation or performance of a test sequence/process. For example, the test mode control circuitry may issue one or more control signals to circuitry of the logic tiles to, for example, implement or enable (i) writing or loading of test mode configuration data to or into a plurality (or all) of the logic tiles in parallel or sequentially, and/or (ii) testing of circuitry in a plurality (or all) of the logic tiles in parallel or sequentially (e.g., using the test mode configuration data), and/or (iii) isolation circuitry in one or more (or all) of the logic tiles to disconnect circuitry under test from circuitry of other logic tile(s) (e.g., e.g., circuitry of adjacent logic tile(s) that is connected during normal operation).

Moreover, the test mode control circuitry may also enable or facilitate read-back of the test data/configuration after one or more logic tiles are programmed, configured or written with test data (e.g., prior to or after implementation of the test sequence). The read-back operation may be employed to verify a test mode configuration(s) and/or test data written to or loaded into such logic tile(s). In addition thereto, or in lieu thereof, the read-back operation may access the data of test results in order to assess the integrity, operability or functionality of the circuitry under test (e.g., in each of the logic tiles). In one embodiment, the read-back operation may employ the configuration port to read the test data/configuration previously written into the logic tile(s)—for example, via parallel writing or loading of test mode configuration data to or into a plurality (or all) of the logic tiles of the programmable/configurable logic circuitry.

Notably, the integrated circuit may be, for example, a processor, controller, state machine, gate array, system-on-chip (SOC), and/or FPGA. Where the integrated circuit is a processor, controller, state machine, gate array, system-on-chip (SOC), such IC may include an embedded FPGA having programmable/configurable logic circuitry comprising a plurality of logic tiles (e.g., arranged in an array of row(s) and column(s)) wherein one or more (or all) of the logic tiles includes programmable components.

In operation, to support configuration and/or reconfiguration of the circuitry of the programmable/configurable logic circuitry (e.g., full reconfiguration), each logic tile may store or use a relatively significant amount of data to configure, for example, the interconnect network within the tile (e.g., Mbytes of configuration bits). In a functional or operational mode (i.e., normal mode—as compared to test mode)), each logic tile of the programmable/configurable logic circuitry (used in or during normal operation) is configured prior to normal operation. In one exemplary embodiment, the functional configuration port for each logic tile is 32 bits wide, thereby permitting each logic tile of the array to be re-configured in approximately 50K cycles. Under these circumstances, in an M×N array, the configuration time grows with N, for each column of tiles that is configured in series (See, e.g., FIGS. 2A and 3A-3C). Notably, the configuration port may be a size/width different from 32-bit—e.g., 2/4/8/16/24/48/64 . . . -bit)—albeit 32-bit port or bus width is used herein for exemplary purposes).

In one embodiment, the configuration bits may be read-back after configuration for verification and testing, and, in one embodiment, the read-back output may employ the configuration port (e.g., the 32 bits wide port mentioned above—albeit, in one embodiment, the read-back output may be a width different from the width of the configuration port). The read-back, verification, and testing operations/processes are described in more detail below.

As mentioned above, in certain aspects, the present inventions includes circuitry and techniques to load or write test configuration data currently (i.e., in parallel) into a plurality of logic tiles (e.g., all of the logic tiles of a logic tile array). Here, test configuration data is provided (e.g., currently) to a plurality of logic tiles of the programmable/configurable logic circuitry and concurrently written into one or more bitcells in a plurality of the logic tiles. The circuitry and techniques of these aspects of the present inventions may significantly reduce the test time and test channels (of the IC test equipment/tool) employed for loading or writing test configuration vectors into circuitry of the logic tiles (e.g., in certain embodiments, by greater than 100×). In one embodiment, the circuitry implemented in the logic tiles, as well as techniques implemented by the logic tiles, facilitate a plurality or all of logic tiles in the logic tile array being configured for test in parallel (e.g., logic tiles of the array are loaded or written with test configuration data concurrently). In addition thereto, or in lieu thereof, logic cores of a plurality or all logic tiles of the array are configured, in one embodiment, using M (e.g., 4) bits of test configuration data—which conserves resources of the tester (e.g., channels of the tester). Where the programmable/configurable logic circuitry includes logic tiles having logic and/or one or more digital signal processor (DSP) cores, such logic tiles are configured, in one embodiment, using N+M (e.g., the 4 bits of test configuration data plus 4 additional bits) of test configuration data—which again may conserve resources of the tester (e.g., channels of the IC test equipment/tool).

Figure 2B:
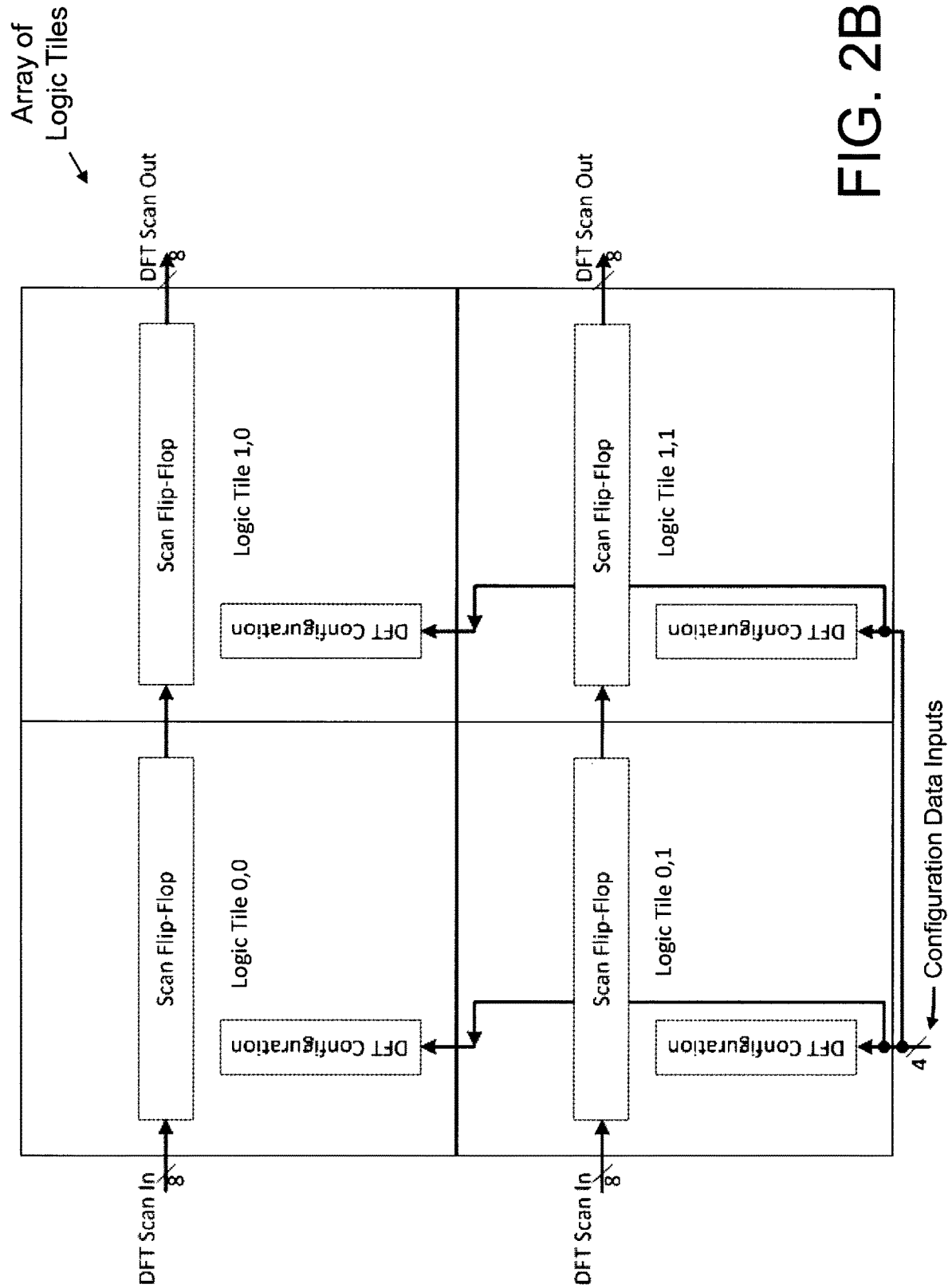
FIGS. 2B and 2C illustrate block diagram representations of a plurality of logic tiles (e.g., arranged in an array of rows and columns—here, 2×2 array of logic tiles—as noted above, the logic tile array (consisting of a plurality of logic tiles) may be any size (e.g., N×M)), according to certain aspects of the present inventions, wherein, in these embodiment, each logic tile includes configuration data inputs to receive configuration test data and configuration circuitry connected thereto; here the configuration test data is written into each of the logic tiles via the configuration data inputs, in parallel (i.e., at the same time), for use in the test sequences; that is, in this illustrative exemplary embodiment, the logic tile array is configured in the parallel load test mode to receive the configuration test data at the configuration inputs of each logic tile in parallel wherein the test data is into the logic tiles in parallel, and some or all tiles can be configured with the same set of configuration test data; moreover, as illustrated in FIG. 2C, the testing of the logic tiles may be implemented in parallel (e.g., the logic circuitry and/or interconnect network of the logic tiles undergo testing in parallel); as noted above, it may be advantageous to electrically isolate or disconnect selected circuitry of each of the logic tiles from circuitry of other logic tiles of the array during parallel testing of circuitry of the logic tiles (e.g., the interconnect network or circuitry of the interconnect network of each logic tile may disconnected from interconnect network(s) of other logic tiles thereby permitting one or more test sequences to be implemented on circuitry of the interconnect network of the logic tile at issue to determine or identify whether of such circuitry is inoperative, faulty and/or insufficiently reliable); in addition, as illustrated, the logic tiles may include scan flip-flop circuitry to implement design for test (DFT) procedures/operation of certain commercially available IC test equipment/tools that employ DFT scan chains; notably, although not illustrated for reasons of focus on certain other inventive aspects, the logic tiles of these embodiments may also include circuitry to facilitate read-back of the configuration test data after one or more logic tiles are programmed, configured or written with test data (prior to or after implementation of the test sequence)
Figure 2C:
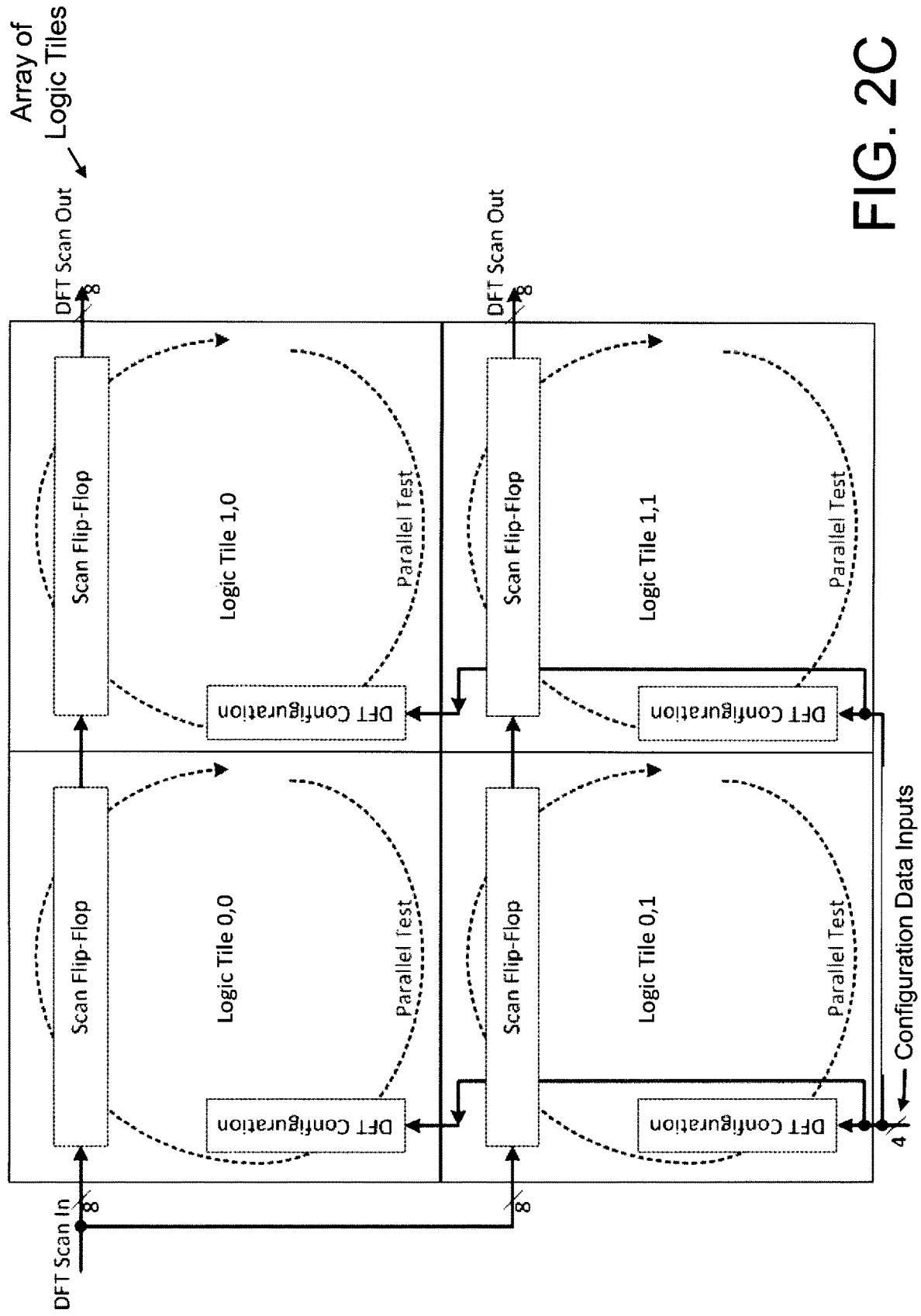
Figure 3A:
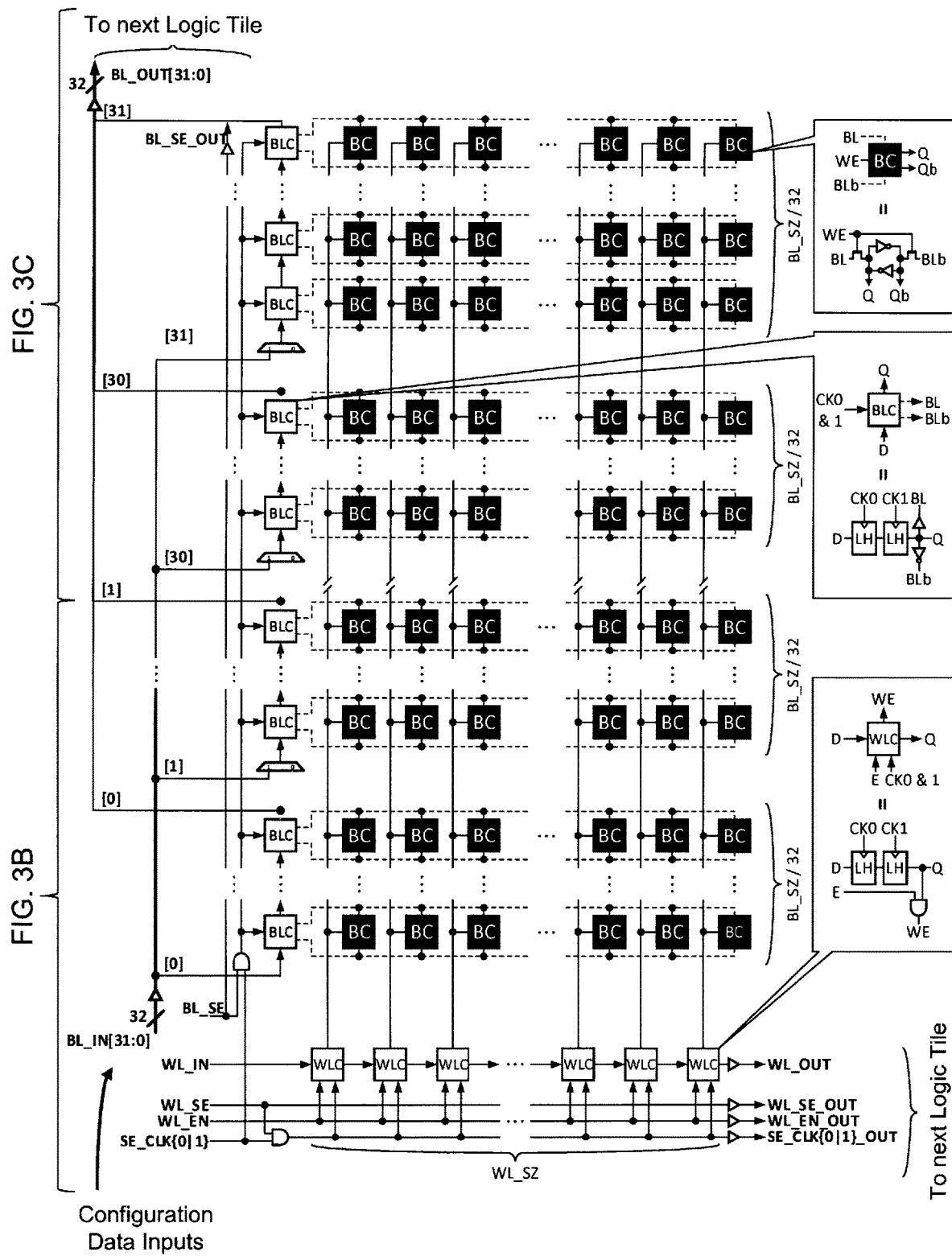
FIG. 3A illustrates, in circuit block diagram form, an exemplary schematic block diagram architecture for functional configuration of a core of a logic tile, during normal operation, according to certain aspects of the present inventions.
Figure 3B:
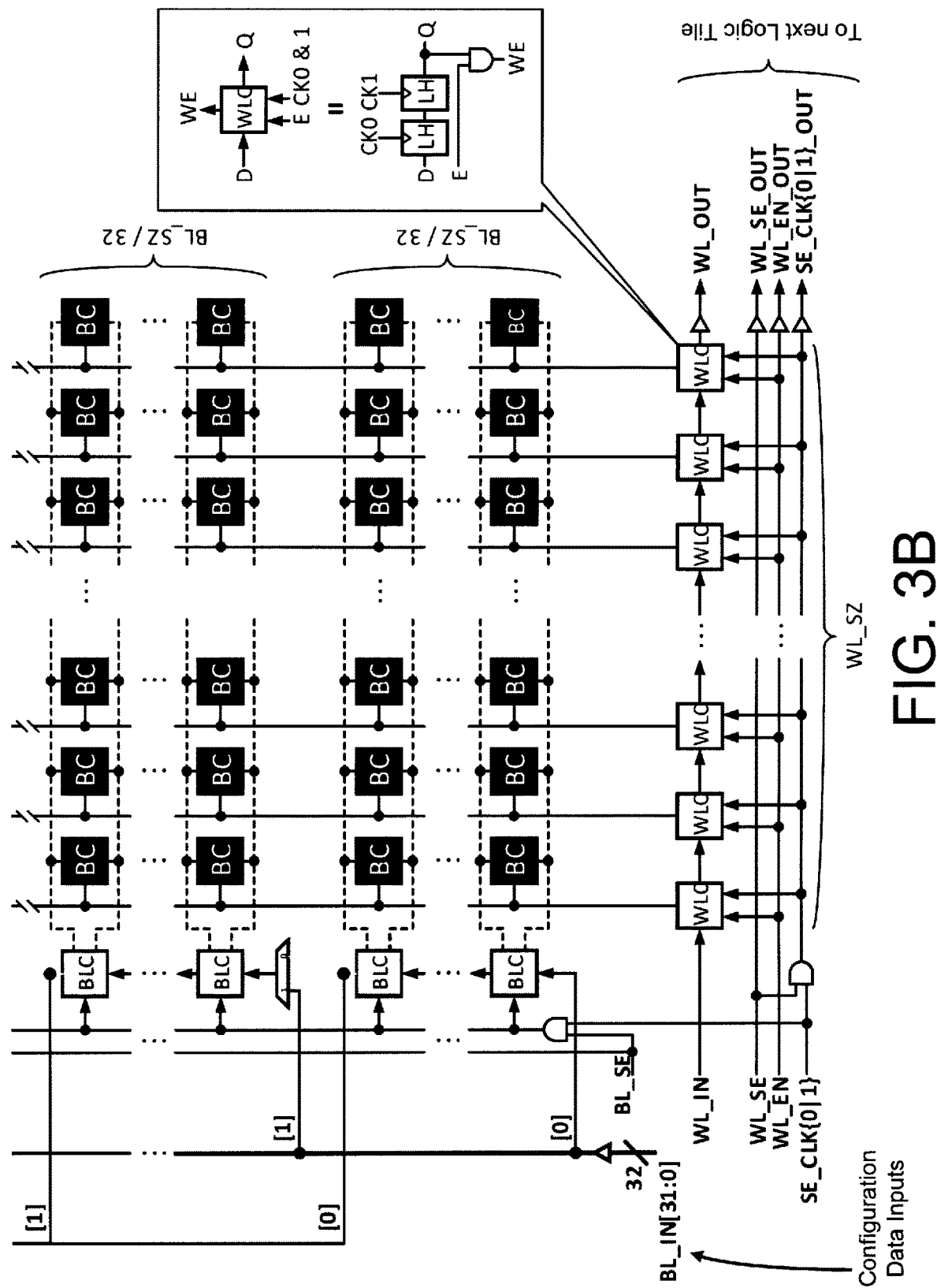
FIGS. 3B and 3C each illustrate selected portions, as identified in FIG. 3A, of the exemplary schematic block diagram architecture for functional configuration of a core of a logic tile of FIG. 3A.
Figure 3C:
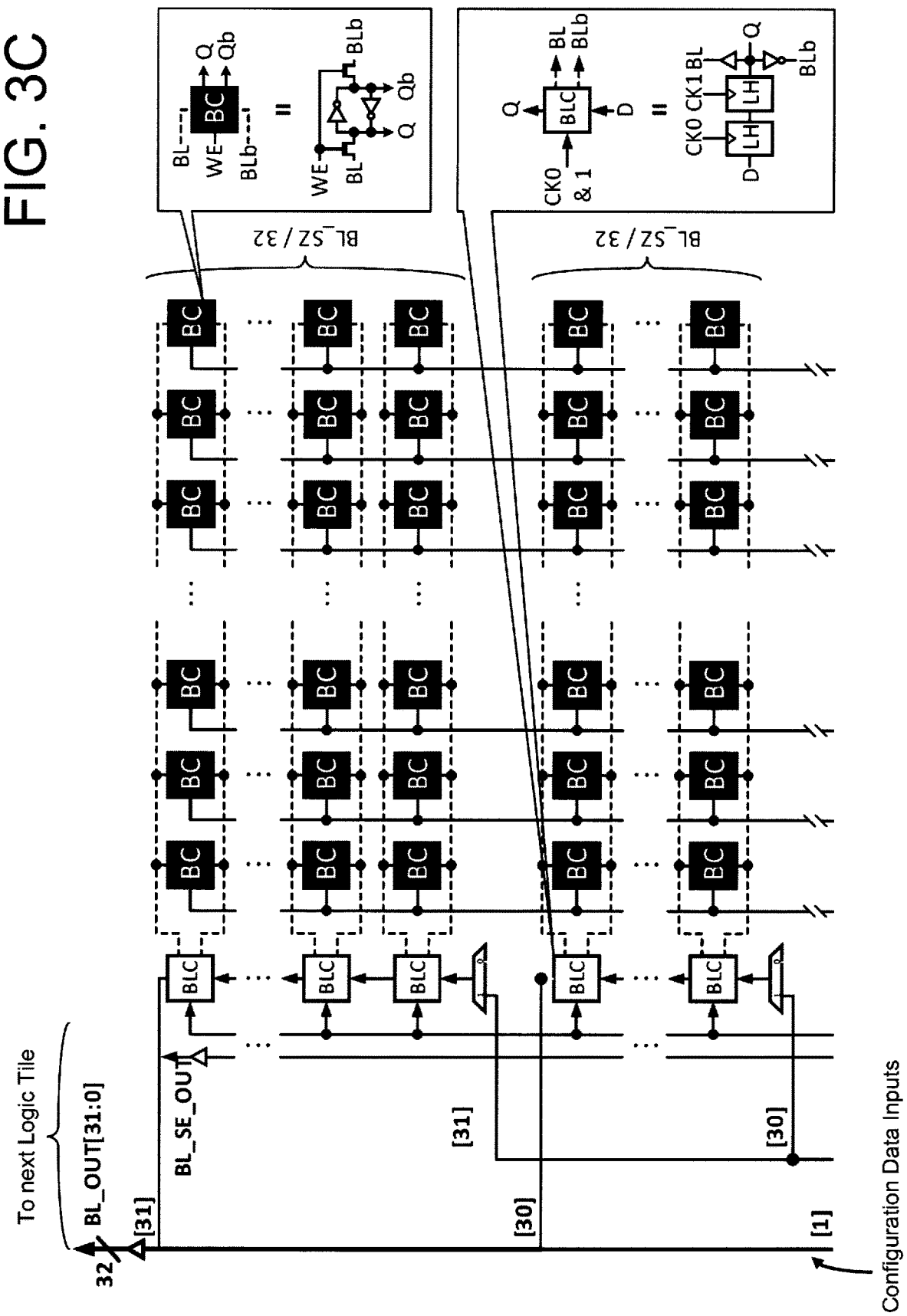

The present inventions are also directed to circuitry and techniques for testing, in parallel, a plurality of logic tiles (e.g., all of the logic tiles of the programmable/configurable logic circuitry). Here, one or more test sequences are performed on circuitry in each logic tile concurrently in the test process/sequence of the programmable/configurable logic circuitry. In one embodiment of the parallel test configuration, each core of a plurality of logic tiles undergoing test is also loaded or written with test configuration data in parallel. The test operation for each of such logic tiles, in this aspect of the present inventions, is performed in parallel (i.e., concurrently). For example, with reference to FIGS. 2B and 2C, the logic tiles include a DFT configuration (note: "DFT" is an acronym for "design for test" and refers to a test procedure or operation). Moreover, in one exemplary embodiment, the core of each logic tile includes 8 balanced scan chains of 1300 (Logic Tile) to 2300 (DSP implemented Logic Tile) flip-flops each, connecting all its internal flip-flops (all scan-FFs). Notably, this configuration/implementation is recognizable by commercial DFT tools (e.g. Mentor Graphics Tessent IC test equipment/tool) as scan chains. Indeed, the DFT configuration chain is recognized by DFT tools as a scan chain with shadow-registers (see configuration architecture described/discussed below).

In addition thereto, or in lieu thereof, in one embodiment, the logic tiles may be "isolated" wherein the circuitry of the logic tile (e.g., I/O and/or interconnect network) is electrically disconnected from external circuitry and/or associated circuitry of other logic tiles (e.g., the interconnect network of other logic tiles) and the test process/operation of the logic tiles may be performed in isolation (relative to other logic tiles of the array of logic tiles). Here, the circuitry of a logic tile under test (e.g., the interconnect network) is electrically "isolated" from circuitry connected thereto during normal or typical operation. In test mode, selected interconnects and/or inputs/outputs of the logic tile may be communicatively and/or electrically "disconnected" or "disabled" from the associated interconnects, circuitry and/or input/output of other logic tiles or external circuitry connected thereto. For example, the output(s) of interconnects of one or more stages of the interconnect network of the logic tile under test that connect to an associated interconnect network of other logic tile(s) during normal operation are looped back into the interconnect network of the logic tile during performance of a test sequence/process of the logic tile. Any other I/O (e.g., Logic I/Os in FIG. 11A) that connects between logic tiles in functional or normal mode maybe be disconnected and looped back in the same or a similar method to the interconnect network (as described herein). In this way, the impact of the operability or functionality of circuitry of other logic tile(s) (e.g., adjacent logic tile(s)) is managed, limited and/or eliminated relative to the testing of circuitry of the logic tile under test.

Thus, in one embodiment, the test mode operation (e.g., scan process) of each logic tile of, for example, programmable/configurable logic circuitry of an FPGA, includes:
1. Load or write the scan chain for configuration bits and scan-FFs into the logic tiles to configure the array of logic tiles;
2. Performance of test mode: capture data for x cycles (e.g., 1 to 8 cycles);
3. Unload or read-out the scan-FF output and check results;
4. Repeat steps 1-3 for each test vector until sufficient or desired coverage is reached or attained.

The circuitry and techniques of the present inventions, in another aspect, are directed to test coverage for configurations of the logic tiles (including, e.g., the interconnect networks within the core of the logic tile). Here, the focus is on configuration bits and testing the cores (e.g., the logic circuitry and/or interconnect network (and circuitry associated with the network)) of the logic tiles in relation to configuration bits. That is, once configured, a goal of testing the core of one, some, a plurality or all of the logic tiles is to achieve high coverage or confidence for all or substantially all configurations. Therefore, one of the present inventions is the circuitry and processes for testing cores in relation to configuration bits and the logic and process controlled by these bits. In addition, it may be advantageous if such cores of the logic tiles are "testable" using commercial DFT tools and are "testable" within a commercially reasonably time using the circuitry and techniques of the present inventions. With that in mind, in one aspect, the circuitry and techniques of the present inventions provide:
1. A configuration architecture that commercial DFT tools can recognize;
2. High-coverage test patterns automatically through the commercial DFT tool to configure the configuration bits of the logic tile and control the scan-FFs thereof;
3. Fault-coverage data via the commercial DFT tool.

Notably, parallel-load, parallel-test mode techniques and circuitry provide approximately 99% stuck-at coverage in a reasonable test time. Here, the test configuration data are loaded into the cores (e.g., the logic circuitry and/or interconnect network (and circuitry associated with the network)) of the logic tiles in parallel. In addition thereto, or in lieu thereof, the cores of the logic tiles may be tested in parallel. Moreover, in one embodiment, the cores of the logic tiles are tested in isolation (relative to the cores of the other logic tiles) wherein the I/O pins that facilitate communication to other logic tiles of the array are "disabled" and electrically "disconnected" from the interconnect network to isolate the logic tile relative to the other logic tiles of the array. (See, FIG. 2C). Here, in test mode, selected interconnects and/or inputs/outputs of the logic tile may be communicatively and/or electrically "disconnected" or "disabled" from the associated interconnects, circuitry and/or input/output of other logic tiles or external circuitry connected thereto. Notably, "pins" are physical points of entry/exit of the signal to the logic tile (e.g., the interconnect network thereof); all physical forms of entry/exit of the signal to the logic tile or circuitry of a logic tile are intended to fall within the scope of the present inventions.

In one exemplary embodiment/implementation, exemplary performance metrics of a logic tile undergoing test performance are as follows:

| | |
|---|---|
| Testable Faults (parallel-load mode) | 99.48% |
| Vector Count (98-99% of all stuck-at faults) | 500-1000 |
| Tester Time | ~5000 cycles per vector |
| | ~100 μs per vector (@ 50 MHz) |
| | 50-100 ms for all vectors (@ 50 MHz) |
| Tester Channels (1 × 1 array, logic) | 12 channels (data) |
| | 10 channels (control) |
| Tester Channels (M × N array, logic + DSP) | 8 + N * 8 channels (data) |
| | 10 channels (control) |

In one embodiment, each logic tile may have a set or plurality of pins that are dedicated to the test mode or operation of the present inventions. In addition, the logic tiles may share one or more pins with the pins employed or used in or during normal operation of the logic tiles. For example, such shared pins may be used during test mode as well as configuration mode. Notably, a pin is a physical point of entry/exit of the signal to the logic tile; all physical forms of entry/exit of the signal to the logic tile are intended to fall within the scope of the present invention (for example, a conductor or metal routing in/of an integrated circuit)

The "pins" and functionalities for an exemplary embodiment are listed below:

| Pin Name | Function | Description |
|---|---|---|
| | Master DFT Mode Selection | |
| | (Remains constant during the entire DFT operation) | |
| DFT_EN | Enables Test Mode for the core of the logic tile | 1: DFT operation<br>0: Functional operation |
| DFT_EN2 | Enables DFT parallel test mode (isolation mode). | 1: DFT parallel test mode<br>0: DFT full-array test mode |
| BL_TEST_EN | Enables DFT Test Mode for the configuration scan chain | 1: DFT configuration<br>0: Functional configuration |
| BL_MUX2/4/8/16/32_S | Enables 2/4/8/16/32-bit/cycle · core for bitstream configuration | 1: 2/4/8/16/32-bit/cycle · core<br>0: 1/2/4/8/16-bit/cycle · core |
| | DFT Pins for RBB Scan Chain | |
| | (Controlled/Captured by RBB Scan Test Procedure) | |
| DFT_SE | Enables RBB scan chain selection for loading and unloading the RBB scan FF | 1: load/unload scan-FF<br>0: Normal FF operation |
| DFT_SI [7:0] | RBB FF scan input for loading the RBB FF | RBB FF scan data |
| DFT_SO [7:0] | RBB FF scan output for unloading the RBB FF | RBB FF scan output |
| DFT_CLK_SEL_IN | RBB clock selection for DFT mode | 1: Select DFT_CLK_IN<br>0: Selection functional clock(s) |
| DFT_CLK_IN | When DFT_CLK_SEL_IN is 1, all FFs in the core are clocked by DFT_CLK_IN instead functional clock(s). This is used to load/unload scan-FF and to perform low-speed capture | DFT clock for scan and low-speed capture |
| | DFT Pins for Configuration Scan Chain | |
| | (Controlled by Configuration Scan Test Procedure) | |
| INIT | Enables bitstream configuration mode for scanning in the configuration bits during DFT | 1: Bitstream Configuration<br>0: Normal Operation |
| SE_CLK0 | Non-overlapping configuration clock | ⎍⎍ Leading edge |
| SE_CLK1 | Non-overlapping configuration clock | ⎍⎍ Trailing edge |
| BL_SE | Bit-line scan enable | 1: Advances the BL scan chain by 1 FF/cycle<br>0: BL scan disabled |
| BL_TEST_IN [31:0] | Bit-line scan input for DFT bitstream configuration | DFT Configuration data |
| BL_TEST_OUT[31:0] | Bit-line scan output for DFT bitstream configuration of the next core above, holds the same data as BL_TEST_IN[31:0] | DFT Configuration data |
| WL_SE | Word-line scan enable | 1: Advances the WL scan chain by 1 FF/cycle<br>0: WL scan disabled |
| WL_IN | Word-line scan input. Propagates a "1" down the WL scan chain to select the WL column to write | 1: Selects the WL column to write |
| WL_EN | Word-line write assertion. In write mode, this writes the BL scan-chain data into the bitcells in the WL column selected by the WL scan-chain In read-back mode, this read the bitcell-data in the WL column selected by the WL scan-chain onto the BL scan-chain | 1: Writes data from BL scan (when RD_EN = 0)<br>or<br>Read data from bitcell (when RD_EN = 1) |
| RD_EN | Control signal for configuration read-back from bitcells onto BL scan chain to be shifted out | 1: Bit-cell read mode<br>0: Bit-cell write mode |
| BL_IN [31:0] | Bit-line scan input for functional bitstream configuration (NOT used during DFT mode) | Function configuration data |

| Pin Name | Function | Description |
| --- | --- | --- |
| BL_OUT[31:0] | Bit-line scan output from the current core to the next core above. In functional mode, this is the configuration data to program the next core. In read-back mode, this is the configuration read-back of the bitcell in the current core. | Function configuration data or Configuration read-back data |

With reference to FIGS. 3A-3C and 4A-4C, in one exemplary embodiment, functional configuration data is input into the logic tile via bit lines (e.g., BL_IN[31:0]), which (in addition) propagates vertically to the next/adjacent tile above (where the data propagation is from bottom to top), and word-line (WL) controls the column of bitcells (BC) to write to, which propagates horizontally to the next/adjacent tile (e.g., the adjacent tile to the right where the data propagation is from left to right). In this exemplary embodiment, there are 2048 columns of BC banks (WL_SZ=2048), and 704 rows (BL_SZ=704). (See, FIGS. 3A-3C). Since BL data is scanned in this exemplary embodiment up to 32-bit parallel, each BL chain segment may be 22-bits deep (704/32), and 2048 banks are written for the full configuration. Notably, in one embodiment, the configuration circuitry does not employ address-decoders to write to the bitcells. In this way, the area of the configuration circuitry is reduced.

Figure 4B:
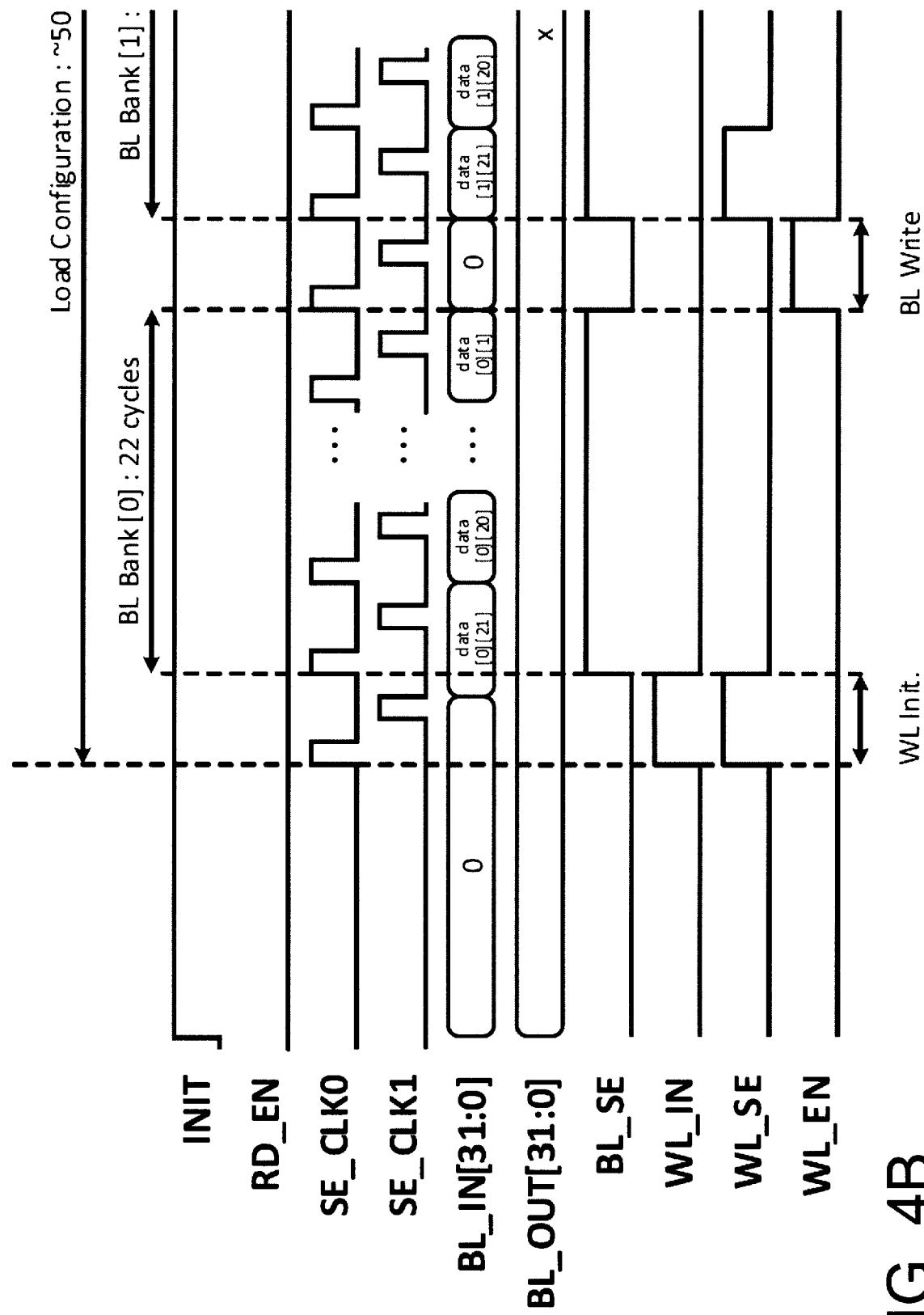
FIGS. 4B and 4C each illustrate selected portions, as identified in FIG. 4A, of the exemplary timing diagram for the functional configuration of a core of a logic tile of, for example, the exemplary architecture FIG. 3A.
Figure 4C:
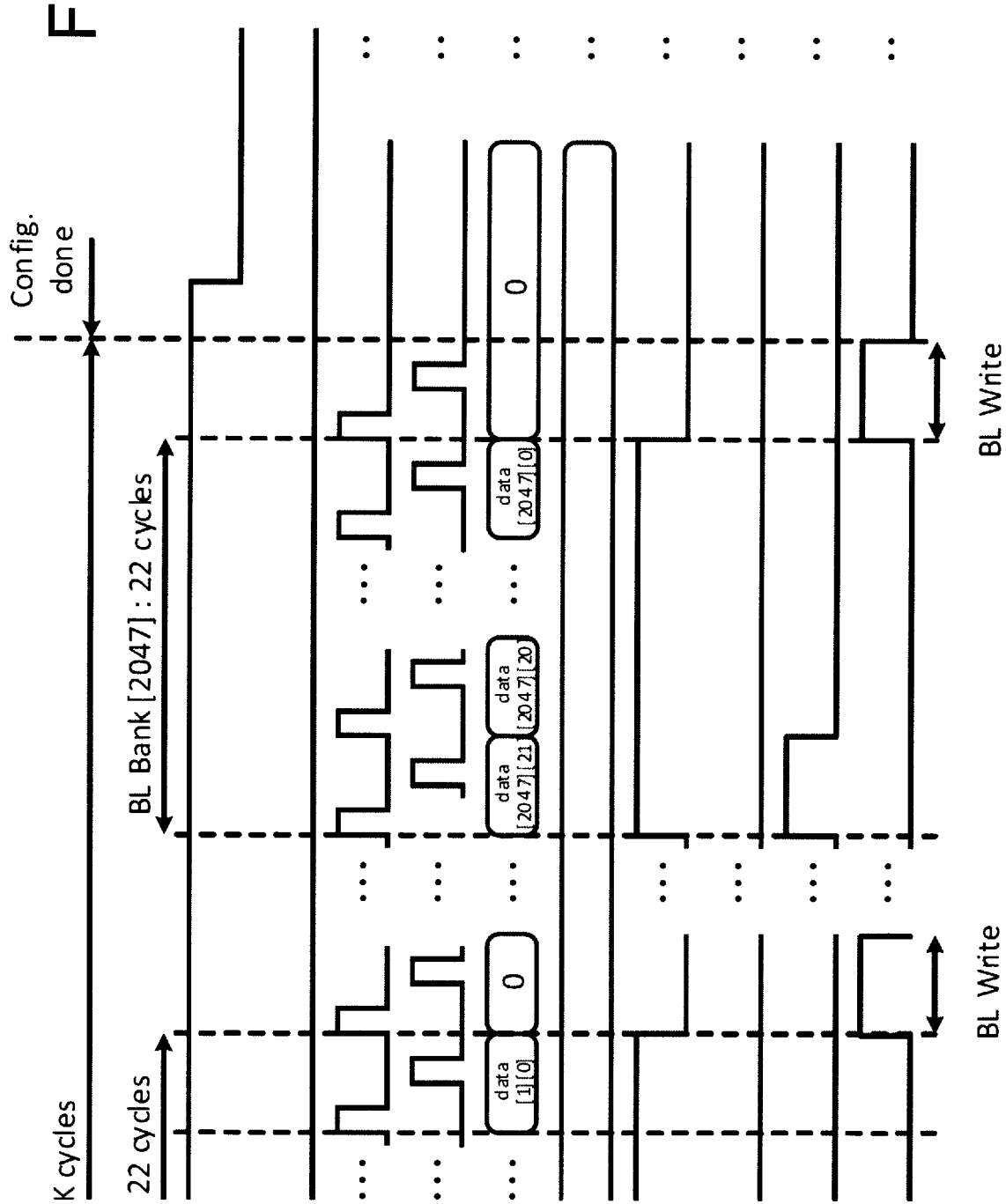
Figure 5A:
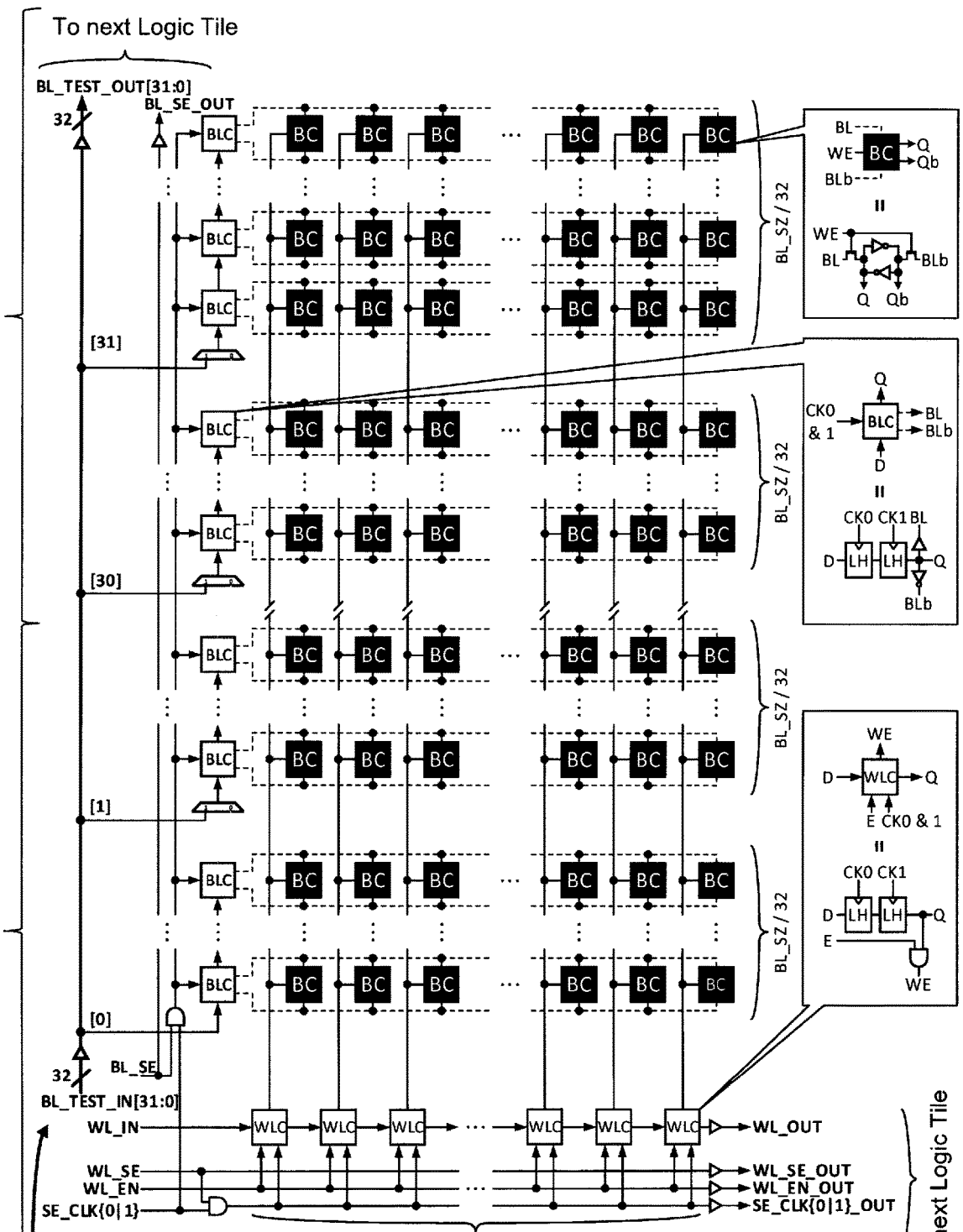
FIG. 5A illustrates, in circuit block diagram form, an exemplary architecture for test mode configuration of a core of a logic tile, according to certain aspects of the present inventions.
Figure 5B:
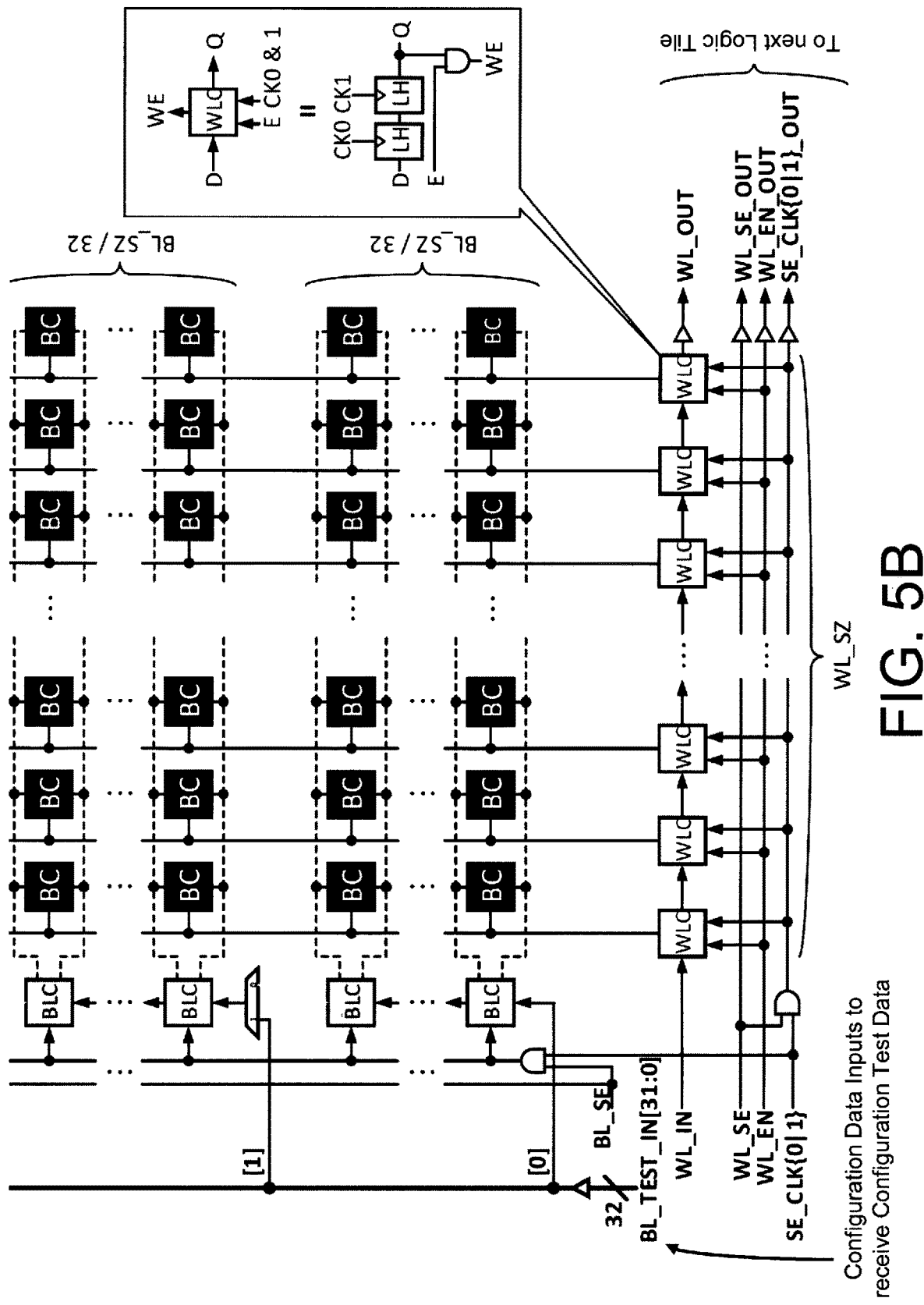
FIGS. 5B and 5C each illustrate selected portions, as identified in FIG. 5A, of the exemplary architecture for test mode configuration of a core of a logic tile of FIG. 5A.
Figure 5C:
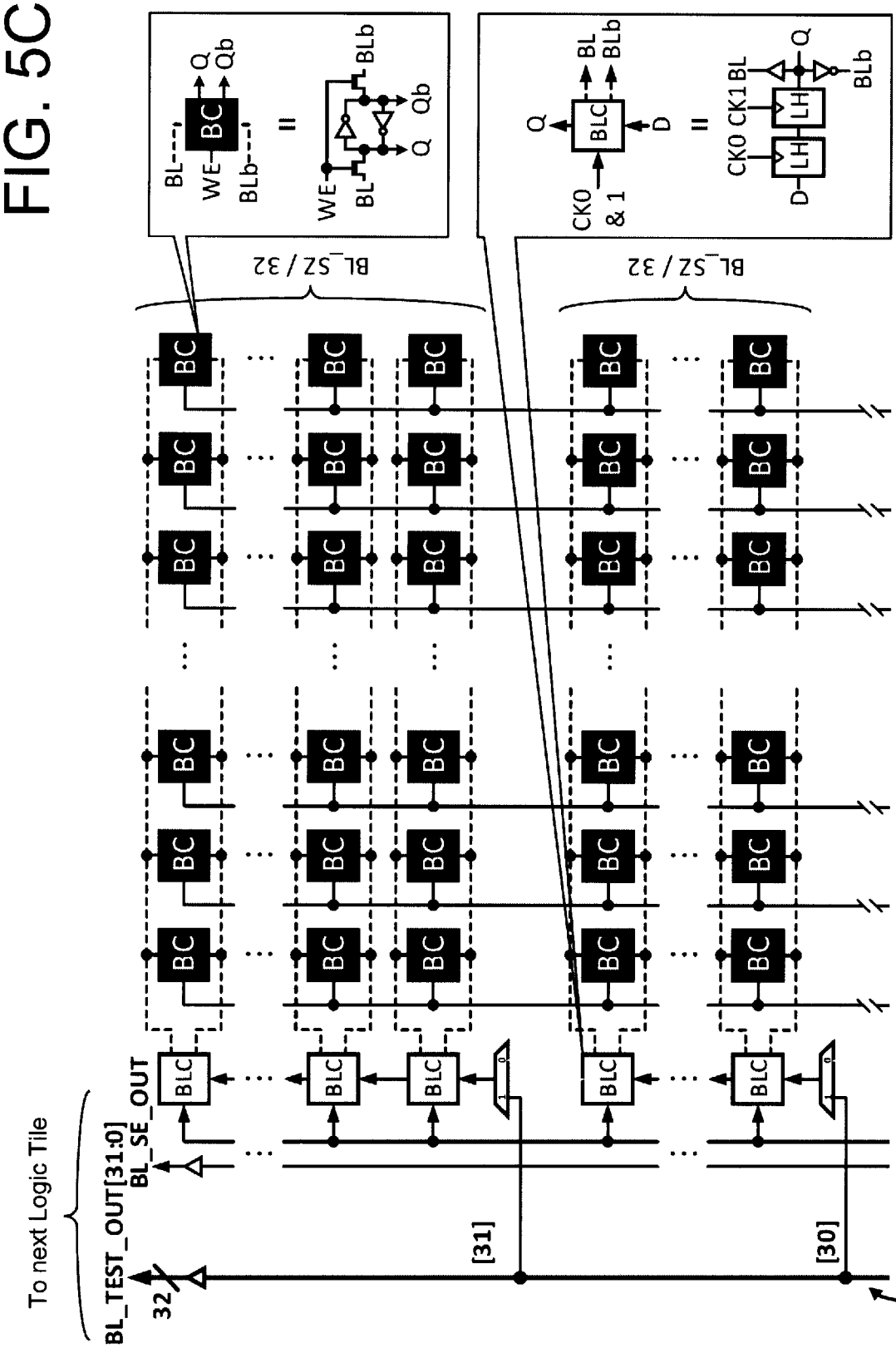
Figure 6B:
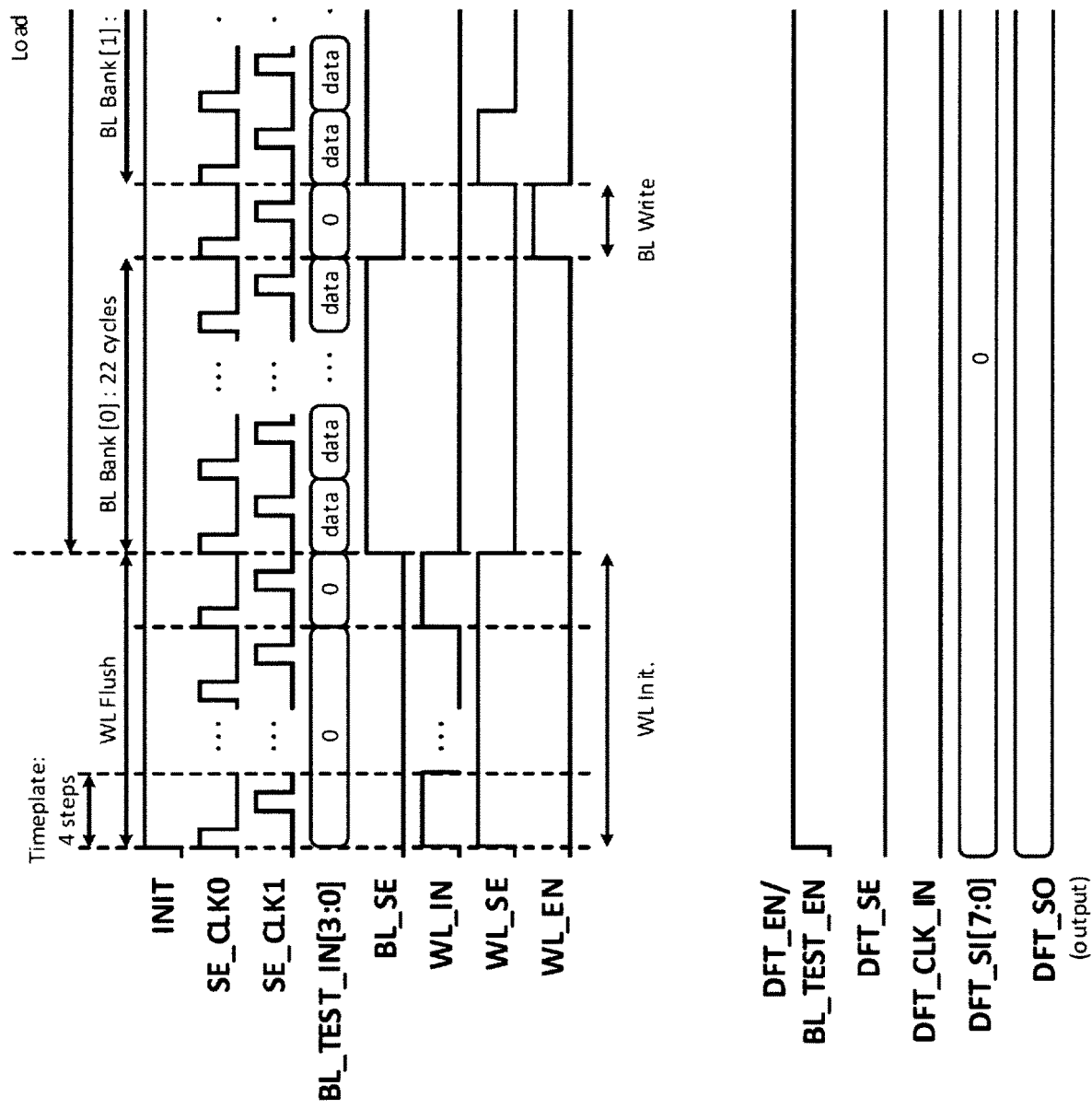
FIGS. 6B and 6C each illustrate selected portions, as identified in FIG. 6A, of the exemplary timing diagram for the test mode configuration of a core of a logic tile of, for example, the exemplary architecture FIG. 5A, according to certain aspects of the present inventions.
Figure 6C:
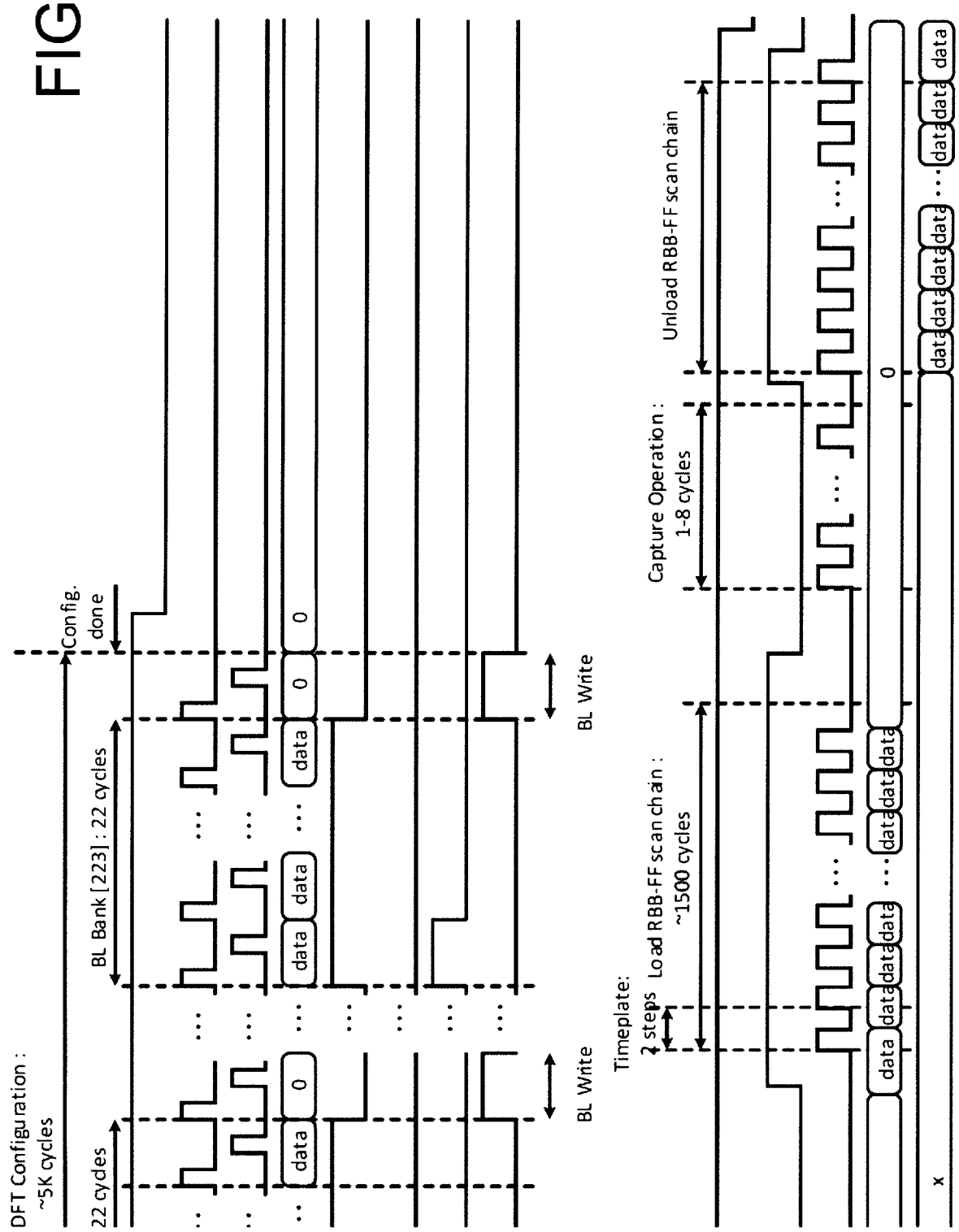
Figure 7A:
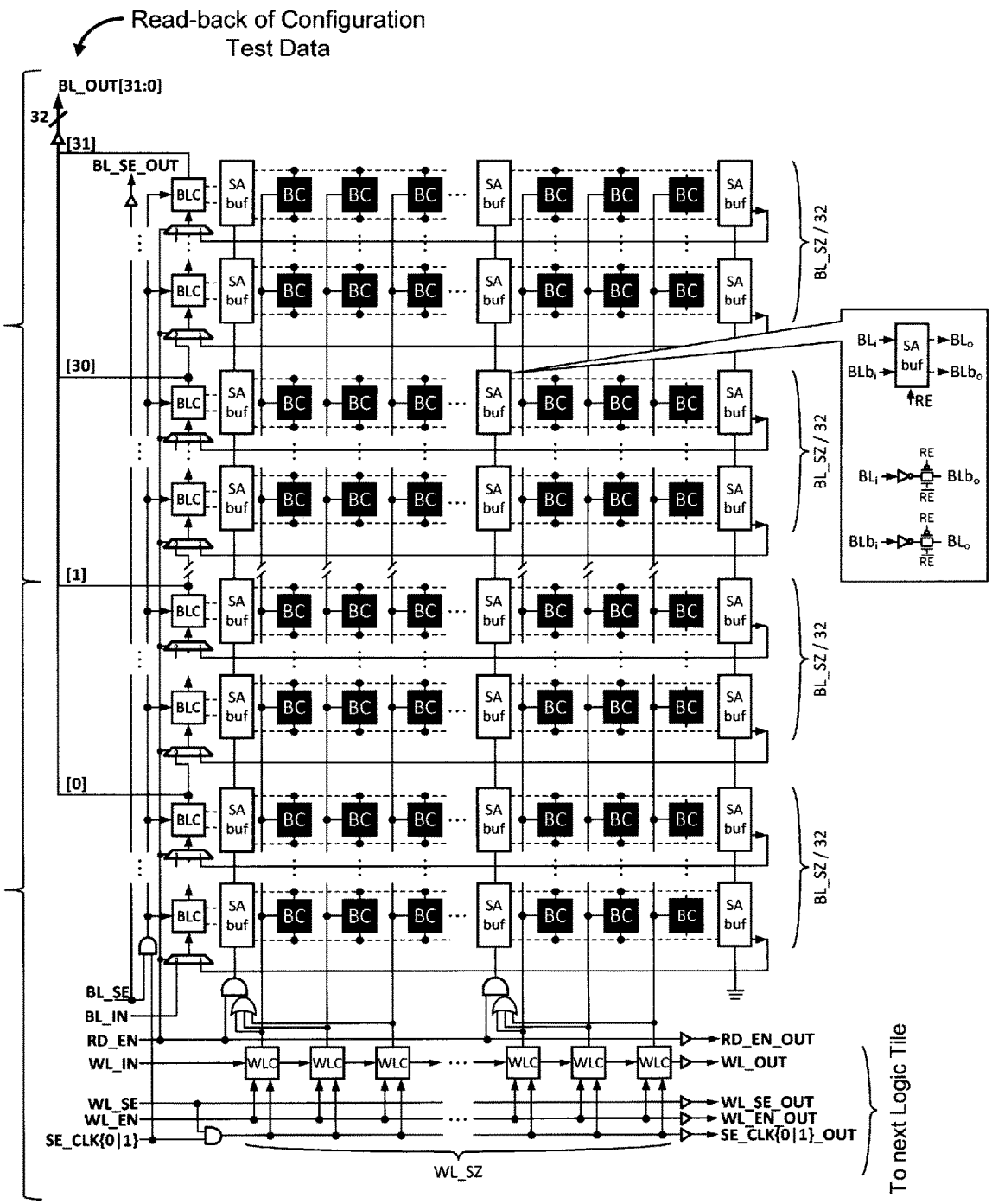
FIG. 7A illustrates, in circuit block diagram form, an exemplary schematic block diagram architecture for configuration read-back of a core of a logic tile, according to certain aspects of the present inventions, of the configuration data (programmed/stored in, for example, the bitcells) and/or the test configuration data (programmed/stored in, for example, the bitcells during a test mode) after one or more logic tiles are programmed, configured or written with test data (e.g., prior to or after implementation of the test sequence); notably, such read-back operation may be initiated or implemented by, for example, the test equipment/tool which may analyze the configuration data and/or test configuration data that is read out of the logic tile or read back by such operation.
Figure 7B:
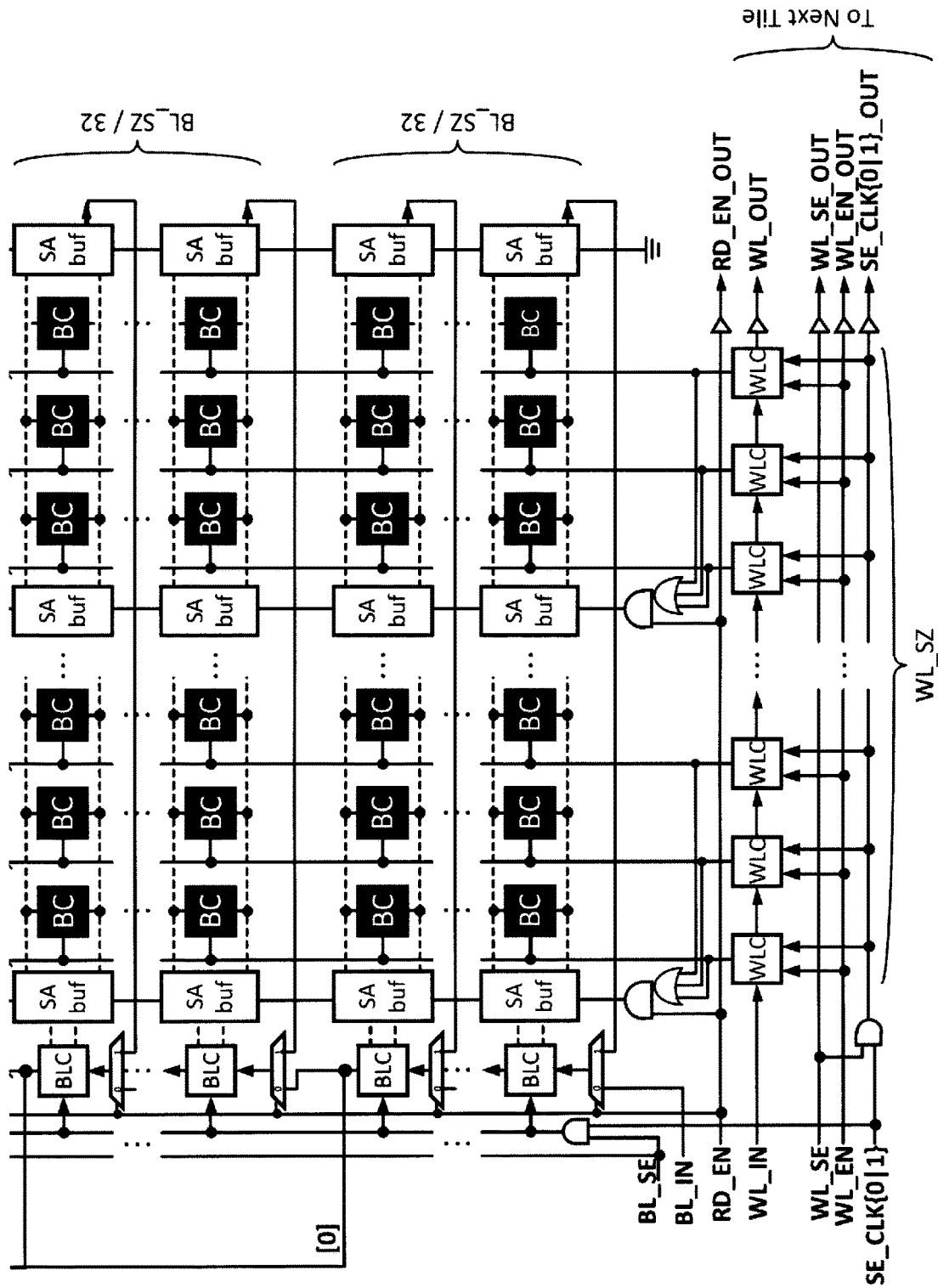
FIGS. 7B and 7C each illustrate selected portions, as identified in FIG. 7A, of the exemplary schematic block diagram architecture for configuration read-back of a core of a logic tile of FIG. 7A.
Figure 7C:
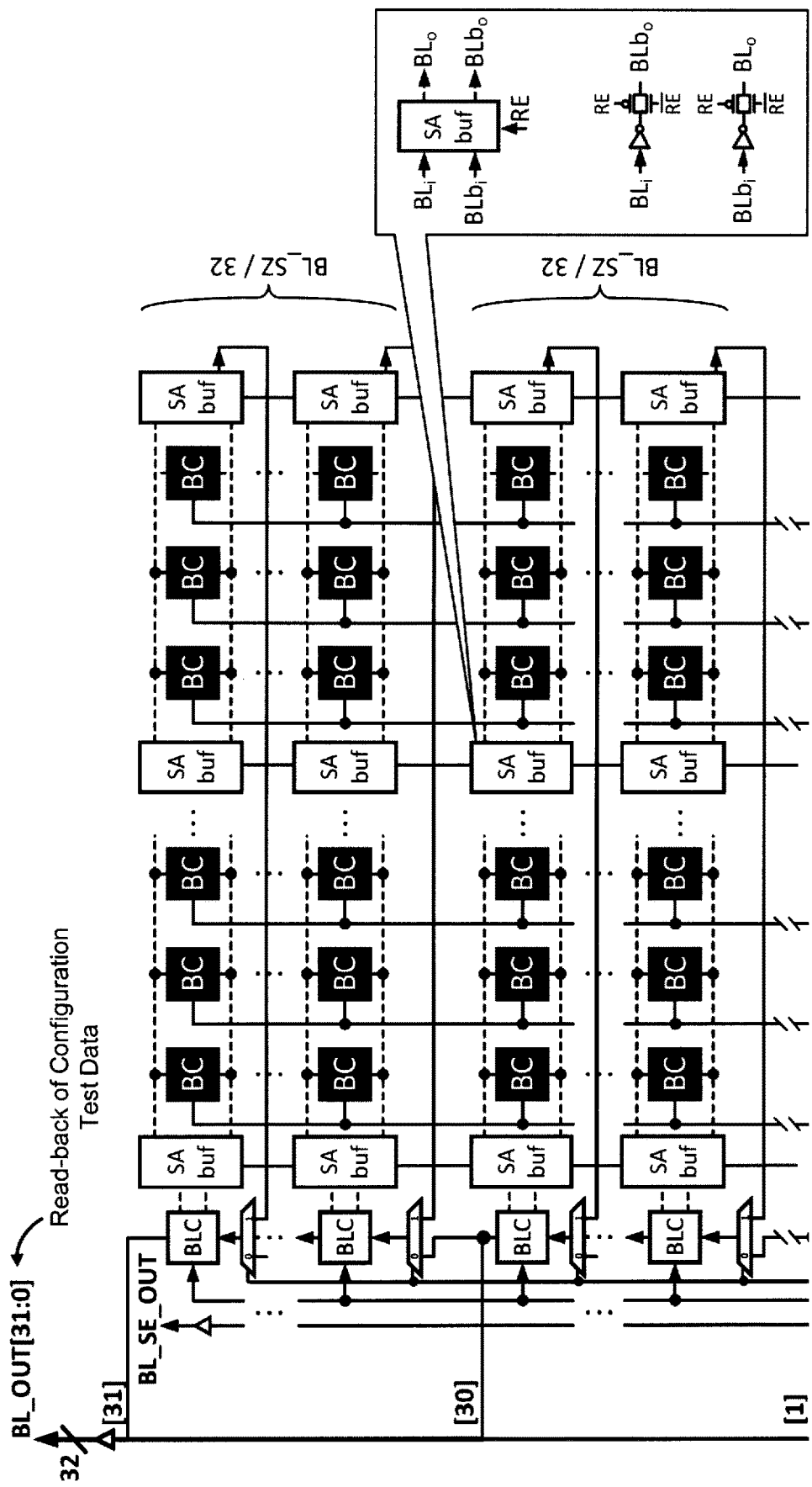
Figure 8:
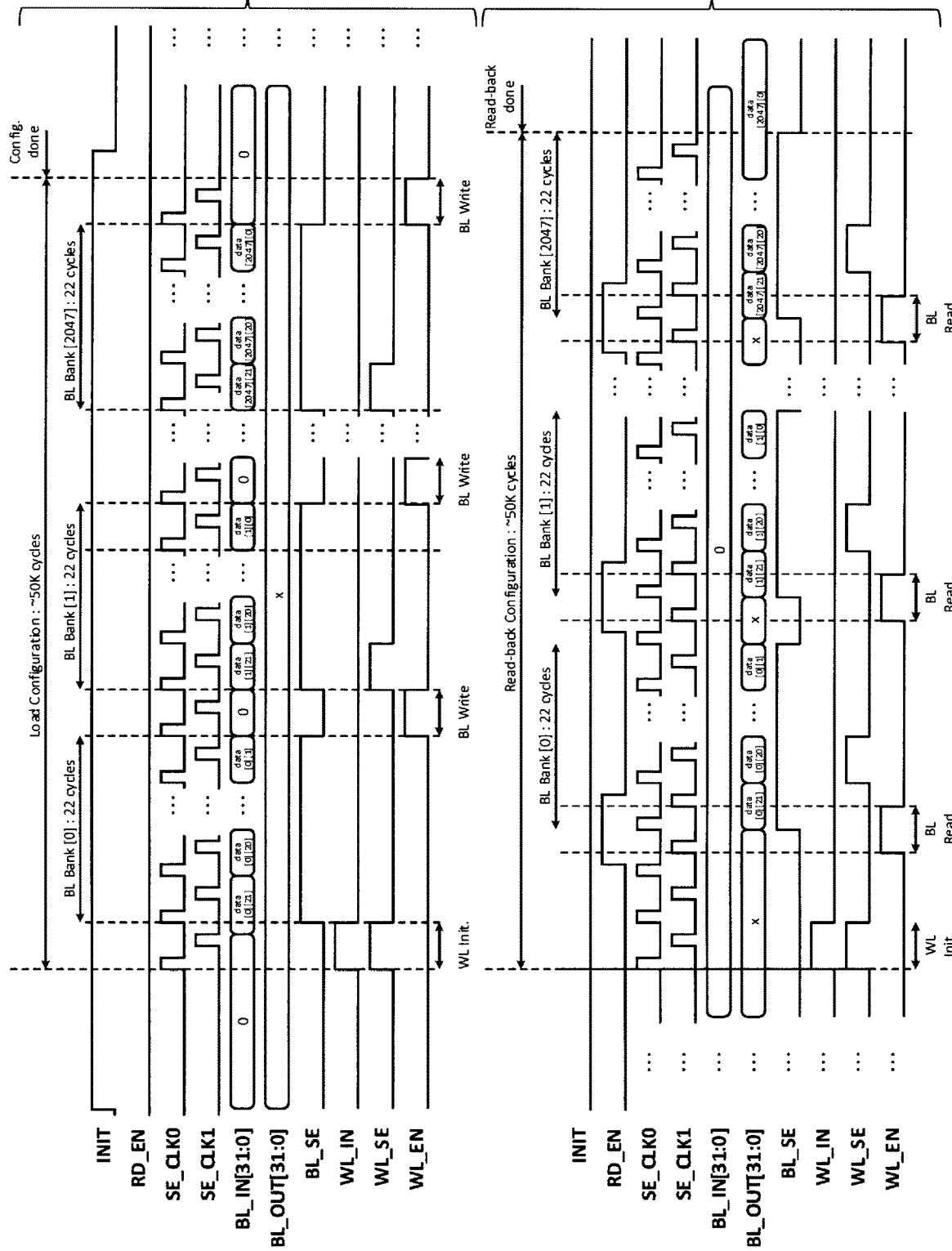
FIG. 8 illustrates an exemplary timing diagram for a functional configuration (i.e., for normal operation) of a core of a logic tile (e.g., the exemplary architecture of FIG. 3A) and a read-back operation of a core of a logic tile, according to certain aspects of the present inventions; notably, the configuration data is written into bitcells in a logic tile via the configuration data inputs (labeled "BL_IN") and, during a read-back operation, configuration data is read from the logic tile via the configuration data outputs (labeled "BL_OUT"); certain of the information identified on the exemplary timing diagrams (e.g., number of cycles and amount of time) are merely exemplary and pertinent to certain particulars of the exemplary architecture of FIG. 3A (e.g., bus width and layout as well as bitcell density and layout); such information is not intended to limiting, in any way, to the scope of the present inventions.
Figures 9A, 9B, 9C:
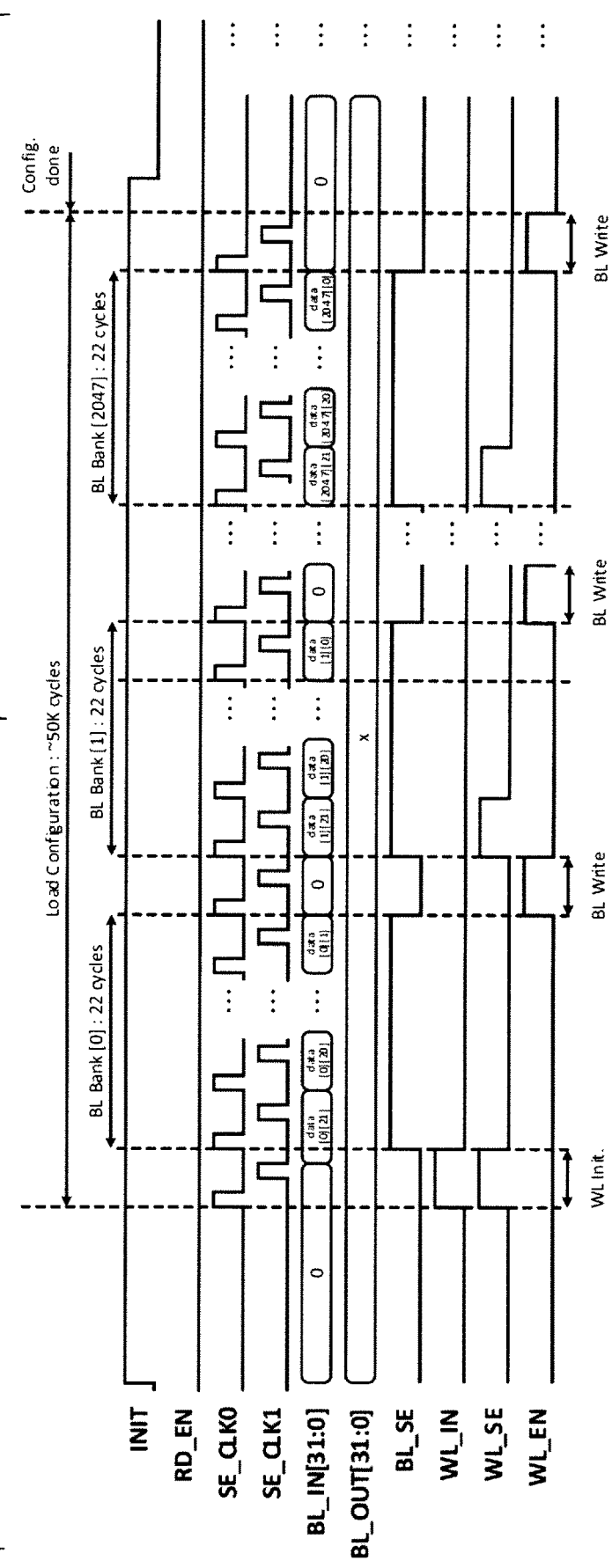
FIG. 9A illustrates an exemplary timing diagram of FIG. 8 for the functional configuration of a core of a logic tile (e.g., the exemplary architecture of FIG. 3A); notably, the configuration data is written into a logic tile via the configuration data inputs (labeled as "BL_IN") for use during normal/functional operation; as indicated above, certain of the information identified on the exemplary timing diagrams (e.g., number of cycles and amount of time) are merely exemplary and pertinent to certain particulars of the exemplary architecture of FIG. 3A (e.g., bus width and layout as well as bitcell density and layout); such information is not intended to limiting, in any way, to the scope of the present inventions.
FIGS. 9B and 9C each illustrate selected portions, as identified in FIG. 9A, of the exemplary timing diagram for the normal operational functional configuration of a core of a logic tile of, for example, the exemplary architecture FIG. 3A, according to certain aspects of the present inventions.
Figure 9B:
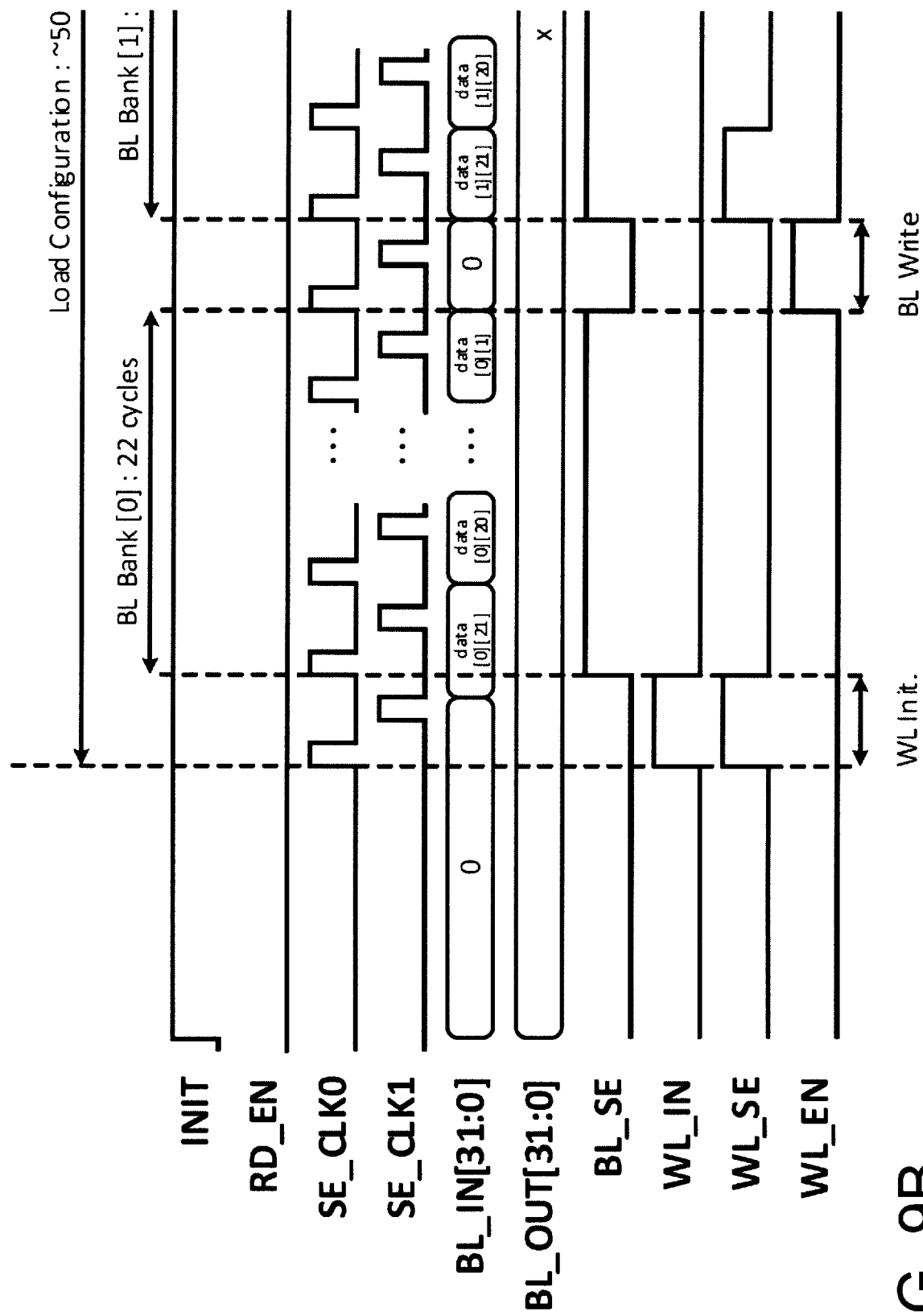
Figure 9C:
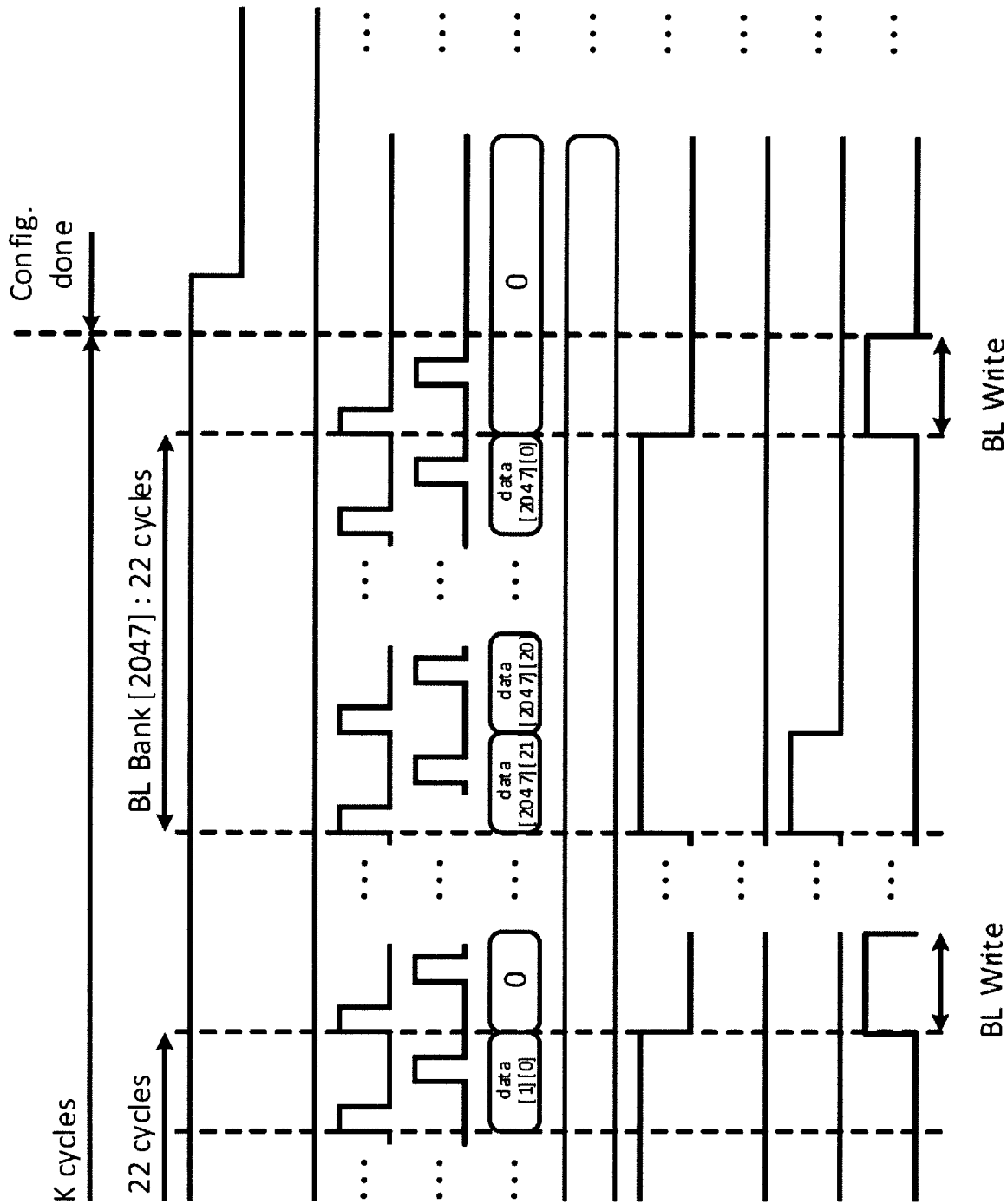
Figure 10B:
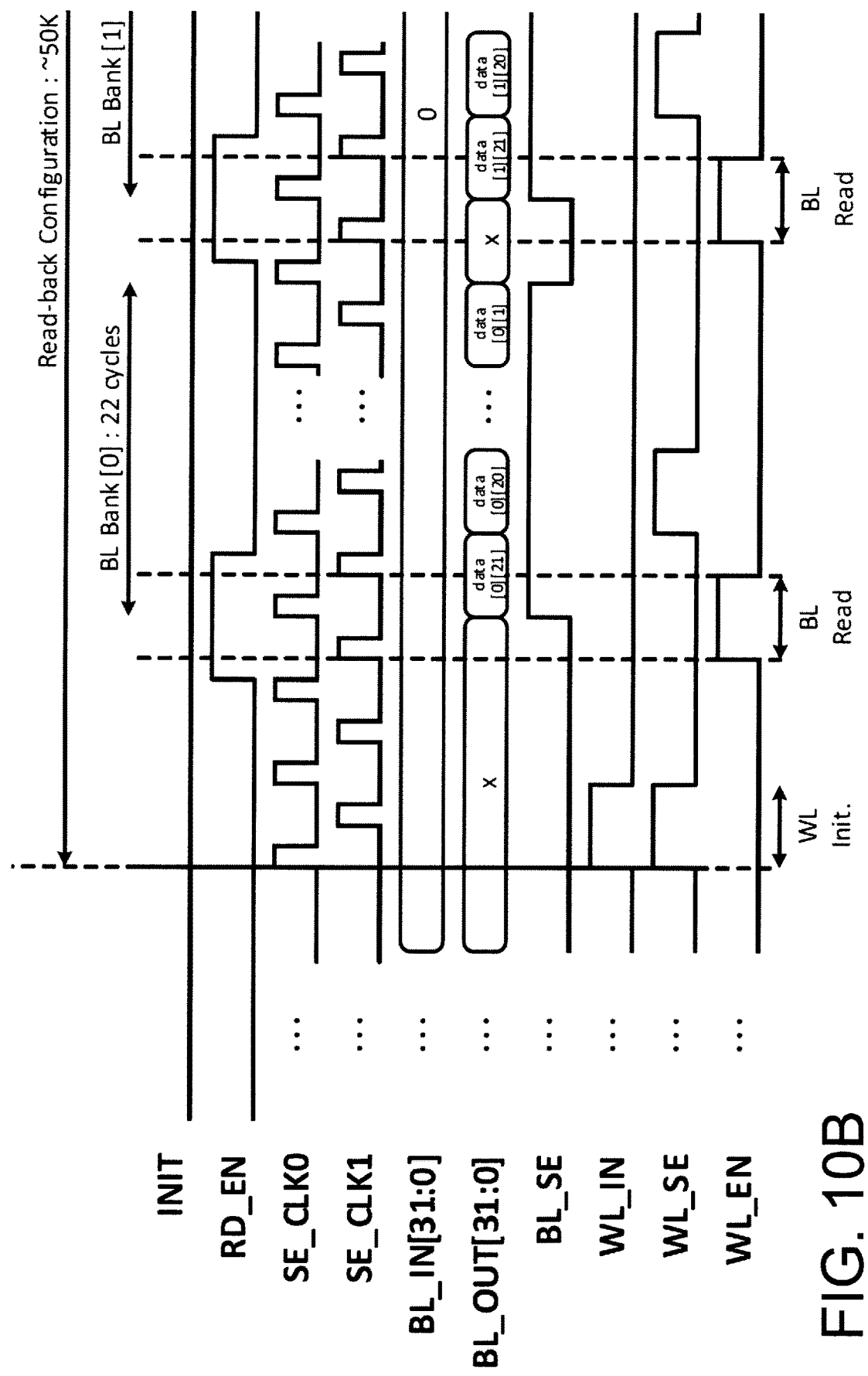
FIGS. 10B and 10C each illustrate selected portions, as identified in FIG. 10A, of the exemplary timing diagram, during a read-back operation, for the read-back configuration of a core of a logic tile (e.g., the exemplary architecture of FIG. 7A), according to certain aspects of the present inventions.
Figure 10C:
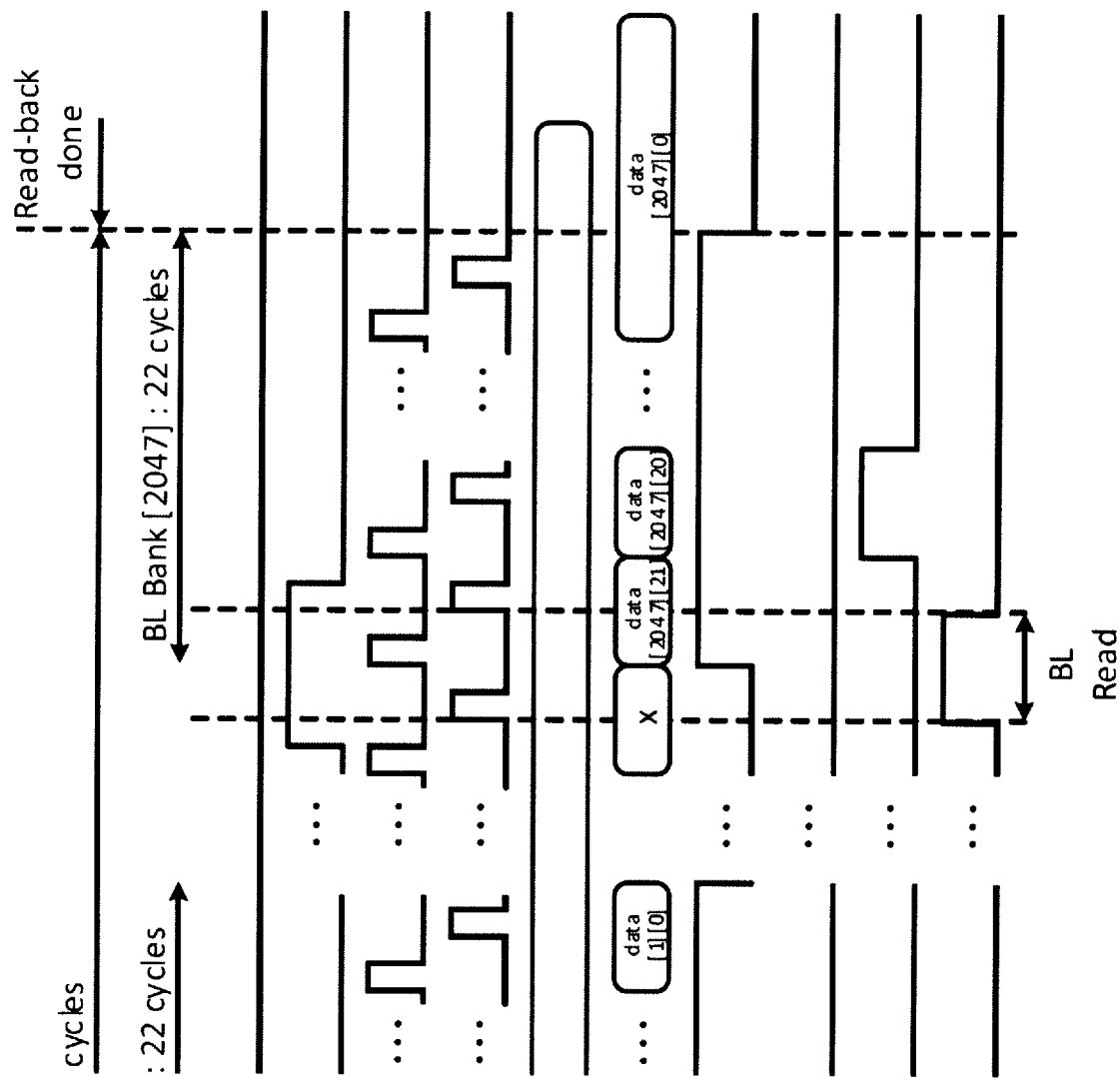

With continued reference to FIG. 4A-4C, in this exemplary embodiment, the bitcells may be written by scanning in one column of BL data through the BL scan chain (e.g., driven by non-overlapping clocks SE_CLK0 and SE_CLK1) for BL_SZ/32 cycles to populate the entire BL scan chain; the WL scan chain is then advanced by one column (e.g. from WL[0] to WL[1]), and then asserting WL_EN to write to the selected column. In this exemplary embodiment, it takes a total of WL_SZ write operations to populate the entire array of configuration bits.

In one exemplary embodiment, the configuration operation or process of the logic tile may use approximately 50K cycles to configure each core in 32-bit write mode (albeit the width of the port may be greater than or less than 32 bits—e.g., 2/4/8/16/24/48/64 . . . -bit). Notably, the time to configure the logic tiles increases as N·50K cycles for an M×N array. While this may be acceptable for functional mode because the core is configured typically once during power-up and usually not re-configured until the next power-up sequence. However, in test operation or mode, this may result in too long a test time because 500-1000 vectors is generally required to reach suitable confidence or coverage, which means up to N·50 million tester cycles and 32 tester channels just for configuration data.

In certain embodiments/implementations of the present inventions, the test mode configuration time has been reduced to 2.5-5 million tester cycles, and only 4 tester channels for the logic tile, and both tester channels and tester cycles are largely independent of any M×N array layout.

The DFT test mode configuration process or procedure is similar to the normal bitstream configuration process, except, in one exemplary embodiment:
1. BL_TEST_IN[31:0] pin instead of BL_IN[31:0] are used to scan in the configuration data
2. BL_TEST_IN[31:0] is directly sent to BL_TEST_OUT [31:0] to drive the BL_TEST_IN of next core above
3. Only 4 unique bits (BL_TEST_IN[3:0]) is required to drive the 32-bit BL_TEST_IN port to save tester channels, and the BL scan time is still only 22 cycles (704/32) per bank
4. Only 224 WL column writes are required in DFT mode (as opposed to 2048 WL columns in functional mode) to write all 2048 banks of bit cells (BCs).

With reference to FIGS. 5A-5C and 6A-6C, in one exemplary embodiment, the test mode configuration technique initially executes the configurations scan chain to configure the core of the logic tile. It is similar to the normal bitstream configuration process, except BL_TEST_IN pins are used to scan in the configuration data. As shown below, in one exemplary embodiment, data is written into the bitcells by scanning in one column of BL data through the BL scan chain (driven by non-overlapping clocks SE_CLK0 and SE_CLK1) for BL_SZ/32 cycles to populate the entire BL scan chain; the WL scan chain is then advanced by one column (e.g. from WL[0] to WL[1]), and then asserting WL_EN to write to the selected column. Under these circumstances, the test configuration uses a total of 224 write operations to populate the bitcells of the entire array of logic tiles with configuration bits for test mode, regardless of the size of the array of logic tiles. Notably, other port dimensions and timing techniques are intended to fall within the scope of the present inventions.

After configuration of the logic tiles is complete for test mode, in this exemplary embodiment, RBB scan chain may be loaded via the DFT_SI [7:0] pin to initialize all the RBB FFs to the desired state. This scan is similar to the scan chain in ASICs: the DFT_SE pin puts all the RBB scan-FFs in scan mode, and the scan data is shifted in serially. The core of the logic tile then operates for N cycles (determined by the test-vector, generally 1-8 cycles), and the states of the RBB FFs are scanned out via DFT_SO to be analyzed for any mismatches.

In those exemplary embodiments where there is non-overlapping clocks on SE_CLK0 and SE_CLK1 (see FIGS. 6A-6C), the timeplate for configuration may employ four steps, so the 5K cycles for configuration would be the bottle neck for test time except for larger (greater than 4×4) arrays. Because the Scan-FF data is concatenated M times for an M×N array (FIG. 1.2), loading/unloading of the 1500-2500 scan-FF's per scan chain per core can become the bottle neck for test time in large arrays. But since the scan-FF can operate on a 2-step template, a 2× reduction in scan-FF tester cycles can be achieved (by packing 2 data samples into a 4-step timeplate) if scan-FF load/unload becomes the bottleneck for test time.

As noted above, in one aspect of the present inventions, configuration architecture of the logic tile implements, provides and/or supports configuration read-back operations. With reference to FIGS. 7A-7C, 8, 9A-9C and 10A-10C, in one exemplary embodiment, configuration data may be read-back from the bitcells via output port BL_OUT (in this exemplary embodiment a 32 bit output port labeled BL_OUT[31:0]). The BL buffers in can be configured as sense-amplifiers (SA buf or buffer, see—FIG. 4C) during read-back (e.g., RD_EN=1), where the selected bank would have its BL tri-stated by the sense-amplifier, so the BC can drive the BL to their stored data, and the remaining sense-amps would buffer the BL data to drive to the right side, where it is multiplexed or muxed into the BL scan chain.

A primary element of the logic blocks is Look-Up-Tables (LUTs), which reside in Reconfigure Building Blocks (RBB) along with flip-flops and auxiliary logic such as data mux and carry chain. In one exemplary embodiment, each logic tile-memory core contains 2,520 6-input LUTs from 630 RBBs. Moreover, each core of the logic tile contains 316 I/O blocks, each providing 2 inputs and 2 outputs for a total of 632 inputs and 632 outputs per core. The I/O RBB microarchitecture diagram is illustrated in FIG. 11A.

Figure 11A:
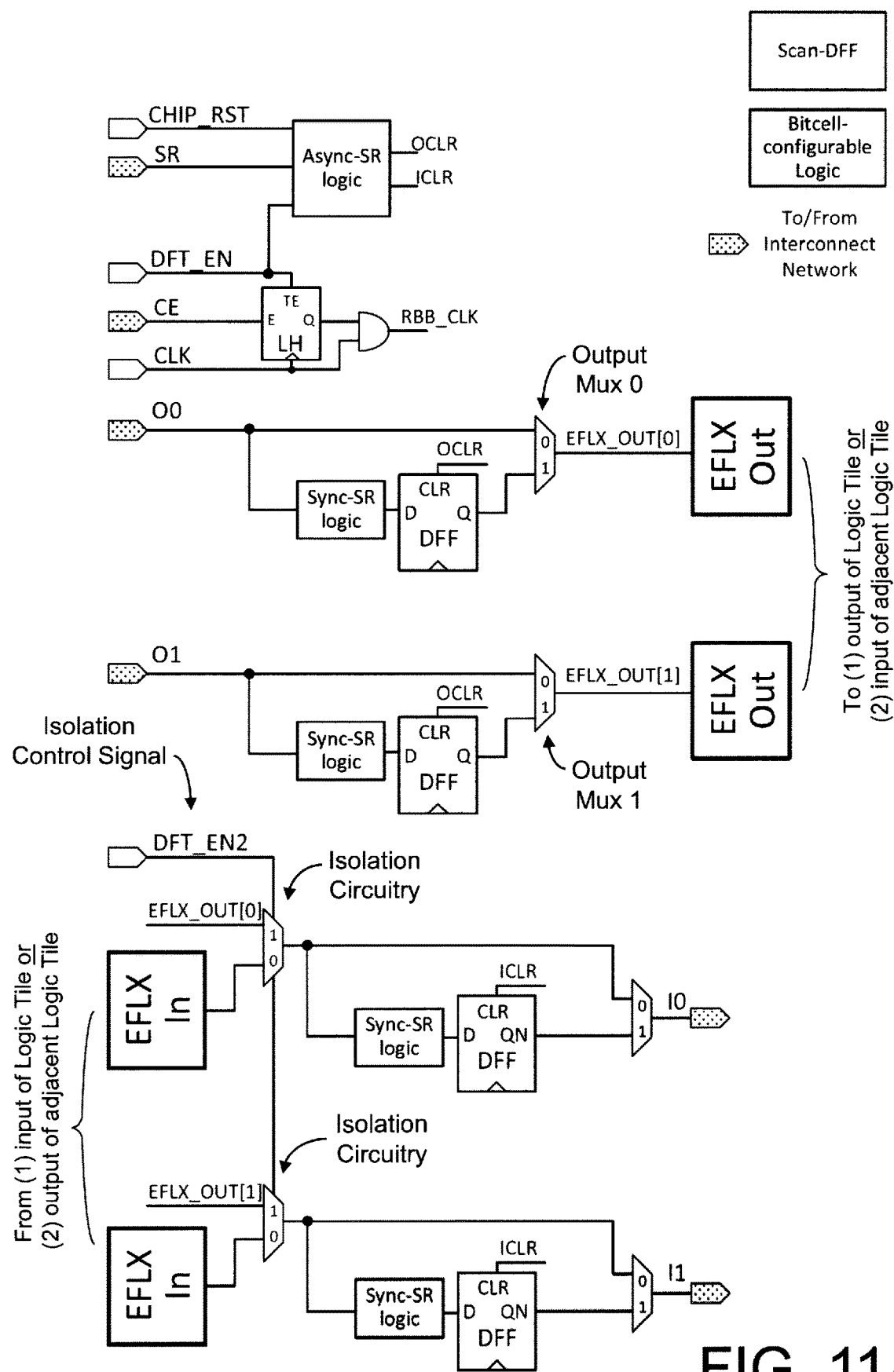
FIG. 11A illustrates, in circuit block diagram form, exemplary schematic block diagrams of aspects of an architecture of an Reconfigurable Building Block (RBB) I/O logic, according to certain aspects of the present inventions; here, the schematic block diagram highlights bitcell-configurable logic, scan-FF, and network I/Os; notably, "EFLX" is an acronym for the logic tile wherein "EFLX In" or "EFLX_In" refers to an input to or conductor connecting to the logic tile of a different logic tile or circuitry external to the logic tile array and "EFLX Out" or "EFLX_Out" refers to an output of or conductor connecting to a different logic tile or circuitry external to the array.

With reference to FIG. 11A, the I/O RBB receives input data into the core (e.g., the logic circuitry of the logic tile) of the logic tile from, for example, circuitry external to the array of logic tiles (such as an SoC), which goes through the optional FF before sending to the interconnect network of the logic tile via pins 10 and 11. The I/O RBB may also be employed to receive input from the interconnect via pins 00 and 01, which in this exemplary embodiment goes through the optional FF before sending to the output (EFLX_OUT[0] and EFLX_OUT[1]) of the logic tile, which drives the external circuitry (e.g., SoC).

During the processes of the test mode (DFT_EN=1), asynchronous reset logic driven by the interconnect network input SR may be disabled to avoid asynchronous reset from being asserted during scan. To not lose coverage, asynchronous reset through dedicated reset pin, CHIP_RST remains supported. Notably, the test mode, in one embodiment, also enables the clock-gating cell, regardless of the clock-enable signal CE from the interconnect network.

These test mode gated signals (such as CE and SR) may be captured by auxiliary logic into the DFFs (note: "DFF"=D flip/flop) to maintain observability. The DFFs in the logic tile RBBs may be scan-FFs.

With continued reference to FIG. 11A, DFT_EN2 is an input signal which controls the parallel test mode of the test mode processes. To better understand its purpose/function, it is helpful to first understand how the logic tile I/Os are connected in an array in one embodiment (see FIG. 11B). Here, when a plurality of logic tiles are arrayed together, the logic tile I/Os on the interior of the perimeter of the array (i.e., not on the outer perimeter of the array) are generally not utilized, and may be connected with the neighboring I/Os. In this way, the logic tile output drives a logic tile input of the neighboring logic tile, and vice versa (see FIG. 11B). Interconnect network I/Os are connected in the same manner, except the boundary interconnect inputs may be terminated or tied-off.

Under these circumstances and in this implementation, each core (e.g., logic circuitry) of the logic tile cannot be tested in isolation relative to the interconnect networks of neighboring logic tiles (i.e., physically adjacent thereto), because its EFLX_IN values depends on the outputs from its neighboring tiles, as well as inputs from the SoC. This may make logic tile testing problematic, since its input from the SoC is driven to known states, and a fault in one logic tile may cause another logic tile to observe a defect, which is not desirable for fault-isolation and fault-detection.

Therefore, most (e.g., 98-99%) of stuck-at faults may be detected in parallel-load mode, which has DFT_EN2 asserted to 1. This gates off EFLX_IN from entering the core of the logic tile, and instead loops-back EFLX_OUT into the EFLX_IN ports (see FIG. 11A). In this way, testing of the logic tiles may be performed isolated and disconnected from the inputs/outputs of the interconnect network of neighboring tiles or, for example, external circuitry (such as am SoC) during performance of the test mode. In addition, in one embodiment, the logic tiles or DSP cores in the array of logic tiles may be loaded with the same configuration data and the same scan-FF data and the test process for each logic tile may be tested in parallel. In this way, the test mode time may be significantly reduced; and, in addition, the tester channels are also reduced.

Figure 11B:
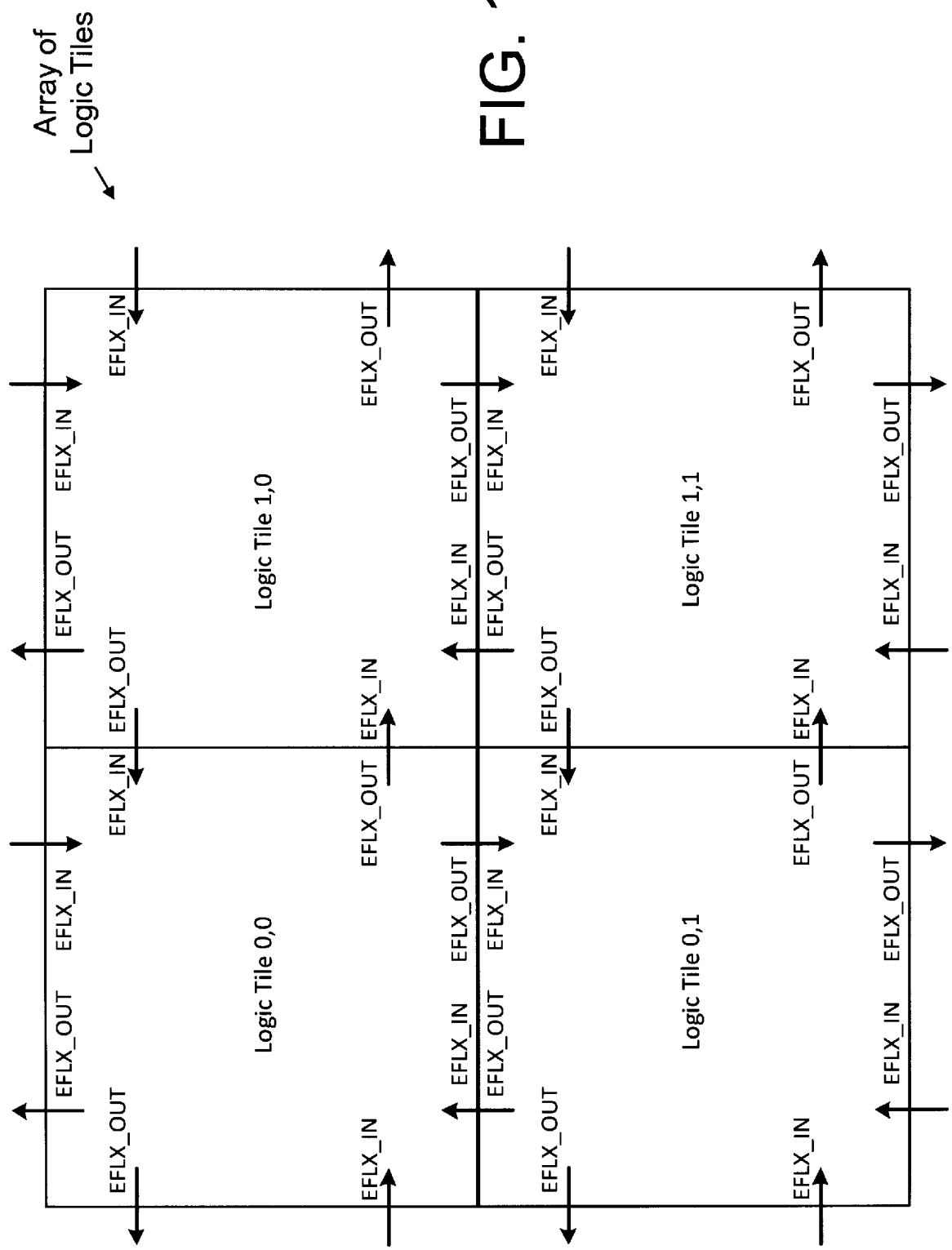
FIG. 11B illustrates, in block diagram form, exemplary I/O connections of a plurality of logic tiles (arranged in an exemplary 2×2 array of logic tiles) illustrating (a) boundary or array perimeter I/Os of the interconnect network and (b) inside or interior edge I/Os of the interconnect network; "EFLX_In" refers to an input to a logic tile and "EFLX_Out" refers to an output of a logic tile; "EFLX_In" and "EFLX_Out" are conductors of logic tiles that are typically employed to connect to circuitry external to the logic tile array; each of the arrows is representative of a plurality of inputs and outputs disposed on the perimeter of the logic tiles; as noted above, the plurality of logic tiles are arranged in an array of rows and columns—here, 2×2 array of logic tiles—albeit the logic tile array (consisting of a plurality of logic tiles) may be any size (e.g., N×M))
Figure 11C:
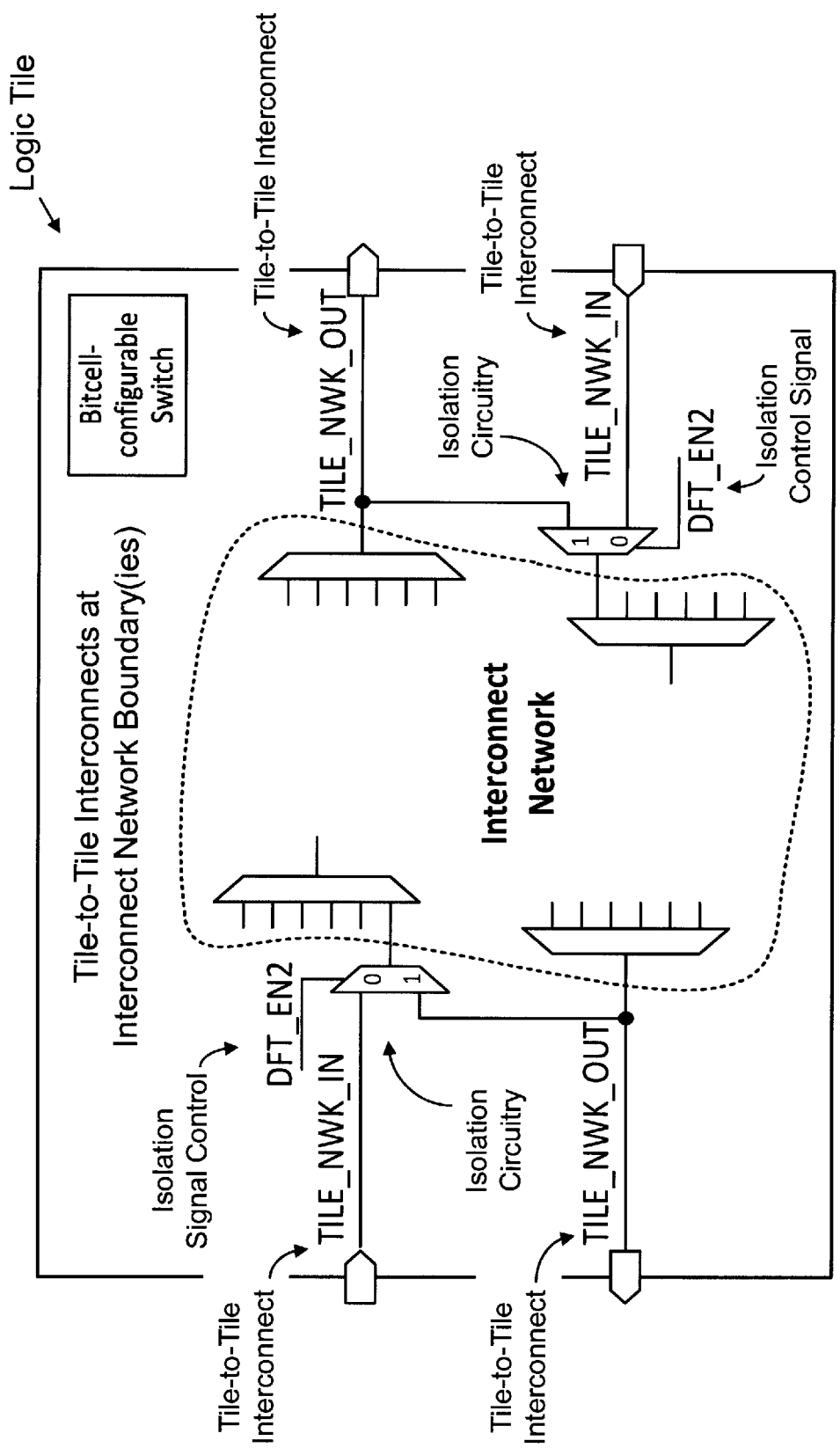
FIG. 11C illustrates, in circuit block diagram form, an exemplary simplified block diagram of aspects of an architecture of interconnect network connections at the boundary (ies) of a logic tile, according to certain aspects of the present inventions, wherein the isolation control signal, when enabled, configures isolation circuitry to disconnect the interconnect network from the interconnect network of the other logic tiles of the array logic tiles; notably, "TILE_NWK_IN" "TILE_NWK_OUT" are acronyms for tile-to-tile interconnects from/to (respectively) an interconnect network of another logic tile of the array of logic tiles (e.g., an adjacent logic tile); each of the arrows is representative of a plurality of tile-to-tile interconnects disposed between the interconnect networks of the logic tiles; that is, although four tile-to-tile interconnects are illustrated herein, it is contemplated that there are many, many tile-to-tile interconnects to other logic tiles of the array in order to facilitate certain types of tile-to-tile communications via the interconnect network each logic tile wherein for reasons of clarity only a few are illustrated herein.

The interconnect network I/Os of the logic tiles (i.e., the tile-to-tile interconnects) may be configured or connected in the same manner (see, for example, FIG. 11C). At the interconnect network portion of the core boundary, TILE_NWK_IN and TILE_NWK_OUT ports connect to the TILE_NWK_OUT and TILE_NWK_IN ports of the interconnect network of neighboring logic tiles, respectively. When DFT_EN2 is asserted, parallel-load model may be enabled and TILE_NWK_OUT is looped-back into TILE_NWK_IN to test the interconnect network or fabric of each logic tile in isolation or disconnected from the interconnect network of each of the other logic tiles of the logic tile array, like that with the I/Os EFLX_IN and EFLX_OUT (see FIG. 11A). In this way, the logic tile may be further isolated by disconnecting the interconnect network from adjacent or neighboring logic tiles during performance of the test mode.

Thus, in test mode, each logic tile may be isolated from connections to the input/output and/or the interconnect network of other logic tiles of the logic tile array. These features may be implemented in any of the embodiments described and/or illustrated herein.

Notably, "EFLX_IN" and "EFLX_OUT" in FIG. 11B are representative of the plurality of inputs and outputs of the logic tiles. Similarly, TILE_NWK_IN and TILE_NWK_OUT are representative of a plurality of tile-to-tile interconnects between interconnect networks of neighboring logic tiles. For example, in one exemplary embodiment, each logic tile has 4096 TILE_NWK_IN and TILE_NWK_OUT signals per side, as well as 632 EFLX_IN and EFLX_OUT signals per core. Having these inputs and outputs electrically disconnected, gated or turned off and outputs looped back inevitability results in some loss of certain coverage. However, it may be advantageous to implement the test mode process and circuitry to maintain the coverage loss to a minimum. In one embodiment, parallel-load results in a <0.5% loss in stuck-at test coverage, but is sufficient for 98-99% stuck-at fault coverage.

In those instances where higher test coverage is desired (e.g. 99.8%), an additional full-array testing mode may be implemented as a supplement, which disables DFT_EN2 and test the entire array as a large fabric, including all the core-to-core connections. Such an implementation may result in a larger test time relative to other implementations described above.

Figure 12A:
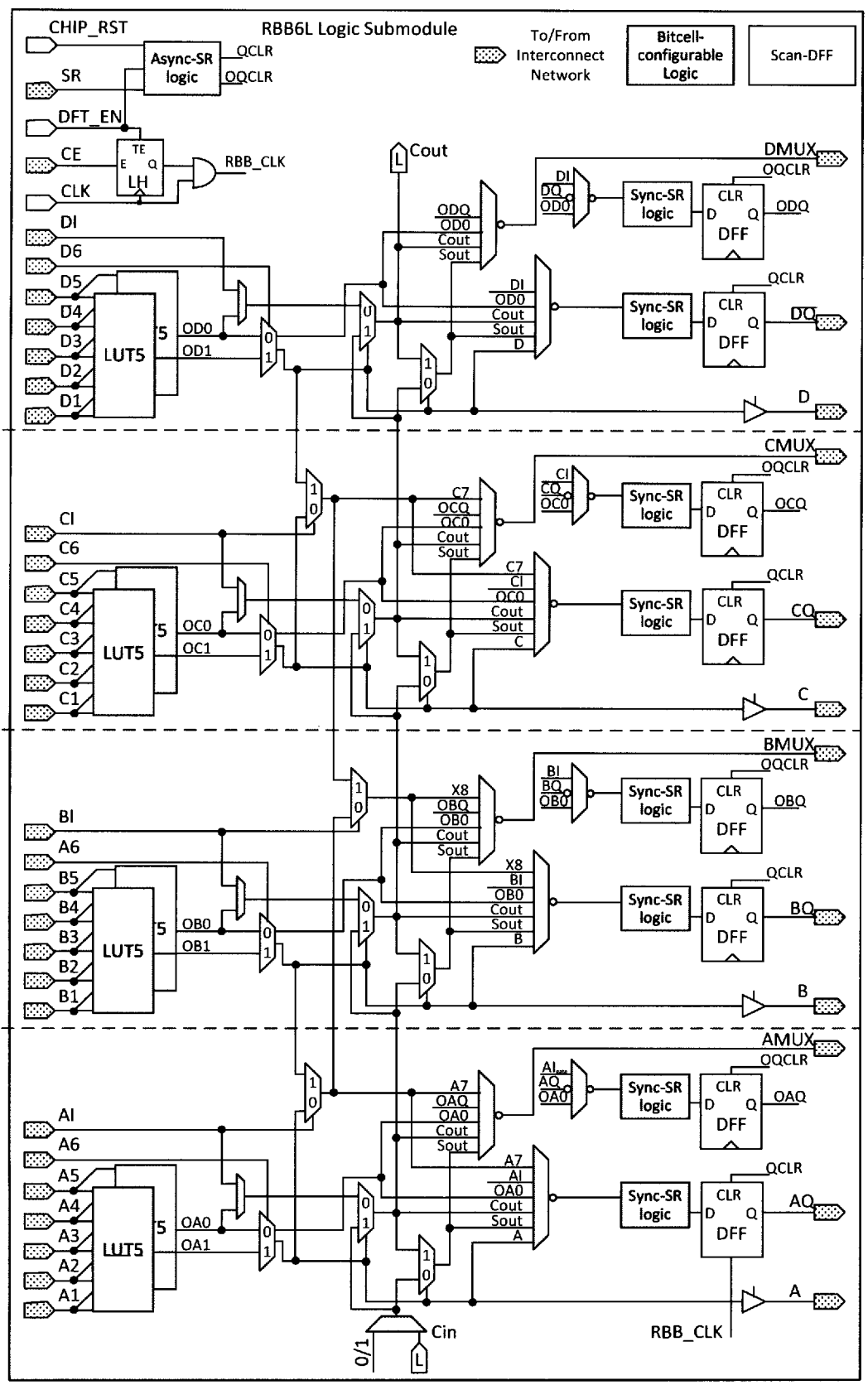
FIG. 12A illustrates, in circuit block diagram form, exemplary schematic block diagrams of aspects of an architecture of a Reconfigurable Building Block (RBB) logic, according to certain aspects of the present inventions; here, the schematic block diagram highlights bitcell-configurable logic, scan-FF, and network I/Os.
Figure 12B:
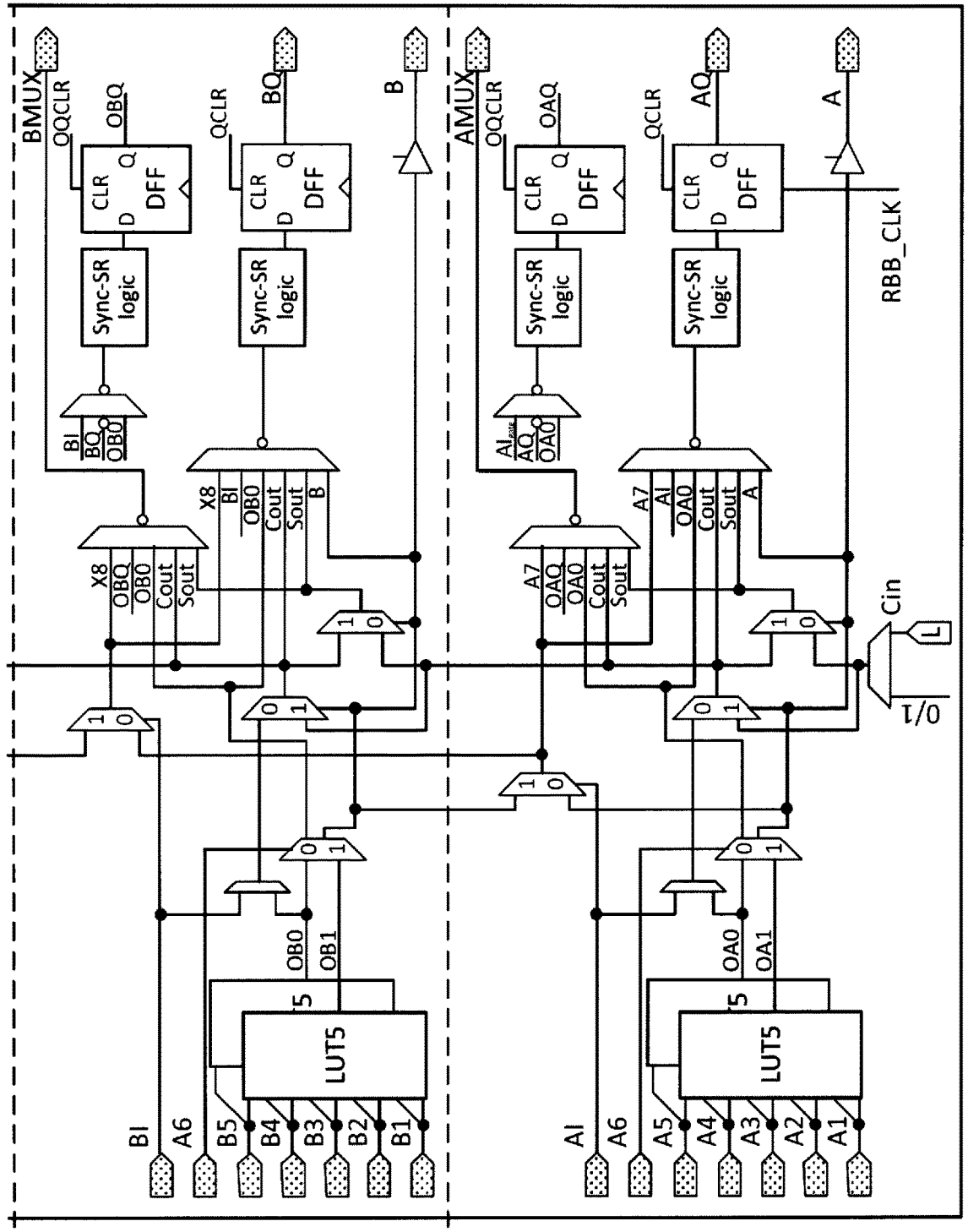
FIGS. 12B and 12C each illustrate selected portions, as identified in FIG. 12A, of the exemplary schematic block diagram architecture of the RBB logic (highlighting bitcell-configurable logic, scan-FF, and network I/Os), according to certain aspects of the present inventions.
Figure 12C:
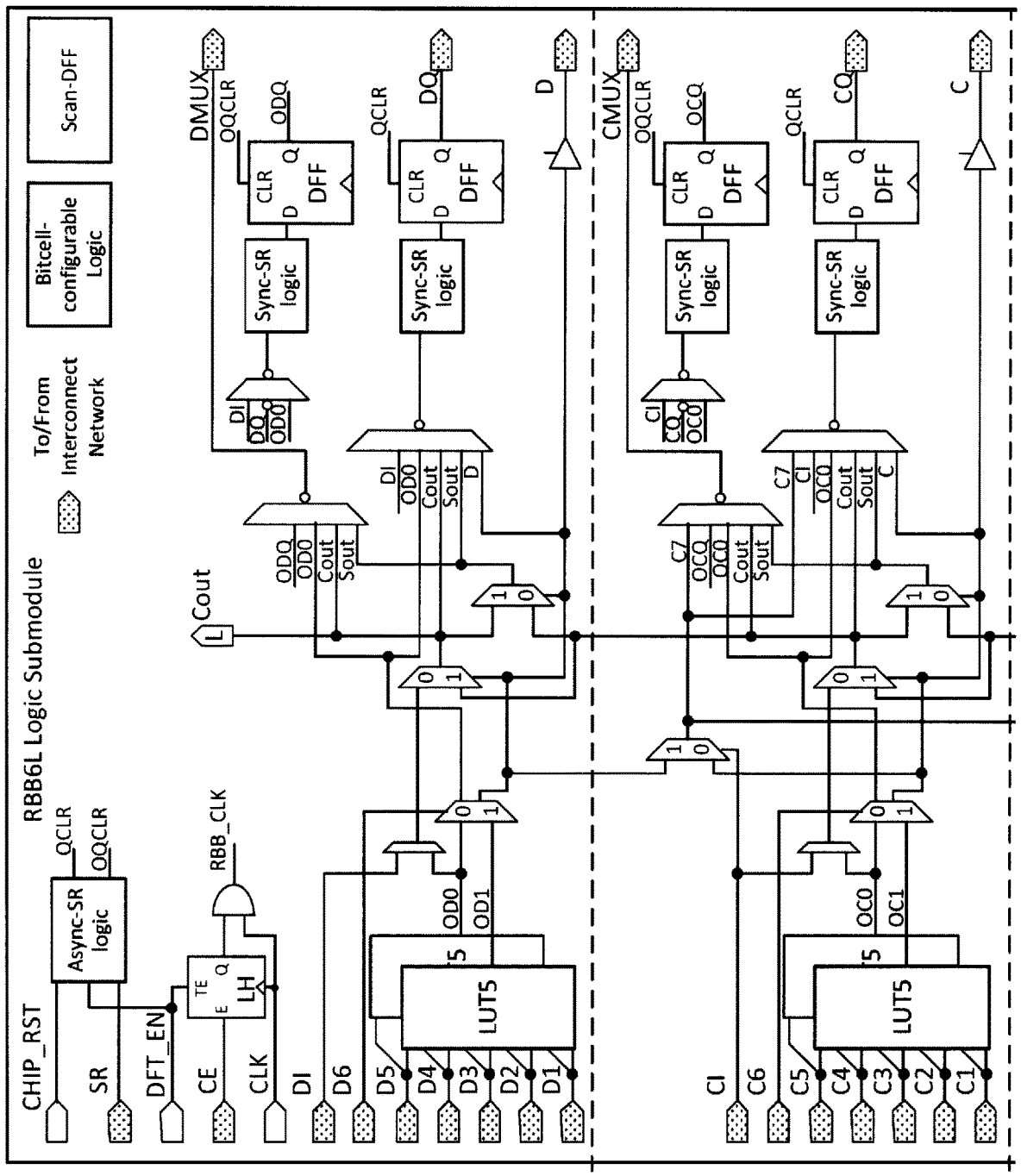

Other than I/O RBBs and interconnect, most of the reconfigurable logic is in the Logic RBB. An exemplary micro-architecture block diagram schematic is illustrated in FIGS. 12A-12C. In one embodiment, each Logic RBB contains 4 pairs of 5-input LUTs, which can behave as single 6-input LUTs. With reference to FIG. 12A-12C, the bit-cell configurable logic cells (shown in grey) are controlled by configuration bits in this exemplary embodiment. These fall in 2 major categories, LUT and FF:

1. LUT behave very much like ROMs, where the ROM values are programmed by the configuration bits, and the LUT input behaves like the ROM address (e.g. A1:A6), which reads out the value from the ROM onto its output (OA0 and OA1 in 5-input LUT mode, or A in 6-input LUT mode).

Based on the mode configured, the LUT output can directly drive the interconnect network (via outputs A, B, C, and D), or be sent into additional multiplexers or muxes (e.g. A7, C7, X8) to form wider LUTs, or be sent to a carry chain to perform addition, subtraction, comparator (e.g. Cout, Sout), which is sent to the interconnect network (via outputs AMUX, BMUX, CMUX, and DMUX). The data input selection for multiplexers AMUX, BMUX, CMUX, and DMUX are also controlled by bitcells based on the configuration.

2. FFs in RBBs are standard scan-DFFs. Each RBB has 4 primary FFs, AQ, BQ, CQ, and DQ, which can select from a number of input signals, including LUT output, mux output, carry chain output, or flop directly the interconnect network inputs AI, BI, CI, and DI. These FF outputs AQ, BQ, CQ, and DQ are directly sent to the interconnect network. There are other applications where the 4 secondary FFs are required, such as:
   a. Dual-5-input LUTs where both output (e.g. OA0 and OA1 needs to be flip-flopped (FF'ed))
   b. Delay lines or synchronization FF's where back-to-back FF's are required (e.g. AQ FF sending data directly into OAQ FF).
   c. High-density logic packing where (for example) LUT A is driving signal to AQ FF, while interconnect input AI is driving signal into OAQ FF.

These example cases require both primary and secondary FF's to be used, and the secondary FF's OAQ, OBQ, OCQ, and ODQ would connect to the interconnect network via multiplexers AMUX, BMUX, CMUX, and DMUX.

Synchronous set-reset of each FF is controlled by configuration bits, where the D inputs to the FF could be asserted high or low when SR signal is asserted.

Asynchronous set/reset for primary FF and secondary FF are driven by separate QCLR and OQCLR signals, respectively, which are controlled by configuration bits. During DFT mode, SR cannot control QCLR and OQCLR signals, only CHIP_RST can.

During test mode (DFT_EN=1), asynchronous reset logic driven by the interconnect network input SR may be disabled to avoid asynchronous reset from being asserted during scan. To avoid loss of coverage, asynchronous reset through dedicated reset pin, CHIP_RST remains supported. DFT mode also enables the clock-gating cell, regardless of the clock-enable signal CE from the interconnect network.

Notably, it may be advantageous that DFT-gated signals such as CE and SR are captured by auxiliary logic into the DFFs in order to maintain observability.

During each load procedure of scan chain, the configuration bits and the data for the RBB scan-FFs must both be loaded. For the unload procedure, only the RBB scan-FFs may be scanned out to verify the function of the core of the logic tile. As discussed above, the configuration bits readback may be performed separately, and, in one embodiment, not re-verified for each vector in order to eliminate or save tester time.

Using the test circuitry architecture and processes discussed above facilitates implementation of the test process on commercial DFT tools (e.g. Mentor Graphics Tessent) which permits creation and use of test-vectors to control both the configuration bits and the scan-FFs.

For example, employing 500-1000 different configurations facilitates achieving 98-99% stuck-at coverage at the core level. Less than 0.5% of coverage loss is due to input-gating and output-loopback at the tile-to-tile boundary of the logic tile. This coverage loss in return for significantly shorter tester time and tester channels may be considered a worthwhile tradeoff. Where additional coverage is desired (e.g. 99.8% or higher), a full-array test mode may be employed (where DFT_EN2=0) to reach the additional 0.5% coverage at the expense of additional vectors.

As mentioned above, most of the LUTs in logic tile function or behave like ROMs, where the ROM values are controlled by configuration bits. However, a small portion of the LUTs can have their ROM values be modifiable at run-time, making them behave like RAMs in certain configurations. Based on configuration, these LUTs may behave or perform like LUT, single-port RAM, dual-port RAM, or shift-registers. In one embodiment, a logic tile has 20 Kb of "RAM" per core, while the DSP core has 1 Kb of "RAM" per core.

Notably, exemplary code (for Mentor Graphics Tessent) of the test processes or modes for the RBB scan-FF scan chain and the configuration scan chain for a logic tile are set forth in FIGS. 13A and 13B. This code is merely exemplary and other code may be suitable. It should be appreciated that methods set forth in FIGS. 13A and 13B may include any number of additional or alternative operations and/or functions; moreover, certain operations/functions shown in FIGS. 13A and 13B need not be performed in the illustrated order, and the methods illustrated in FIGS. 13A and 13B may be incorporated into a more comprehensive procedure or process having additional functionality not described in detail herein.

As noted above, there are many inventions described and illustrated herein. For example, the present inventions are directed to circuitry and techniques for testing, in parallel, a plurality of logic tiles of an integrated circuit. In addition thereto, or in lieu thereof, the present inventions are directed to circuitry and techniques for writing or loading, in parallel, configuration data (e.g., test mode configuration data) into a plurality of logic tiles (e.g., bit cells) to determine or assess the functionality and/or operability of the circuitry in/of each of the logic tiles. In one embodiment, circuitry of each of a plurality of or all logic tiles are tested or undergo one or more test sequences concurrently (i.e., at the same time) in a test process/sequence of the programmable/configurable logic circuitry. In another embodiment, circuitry of each of the plurality of logic tiles are tested serially wherein one or more of the test sequence(s) are performed with respect to circuitry of each logic tile or each group of logic tiles at different times (e.g., sequentially from the other logic tiles and/or groups of logic tiles of the programmable/configurable logic circuitry). Notably, the present inventions may implement any test sequence/process and/or test data/test mode configuration data now known or later developed; all of which are intended to fall within the scope of the present inventions.

The present inventions are also directed to isolating or disconnecting circuitry of the logic tiles from circuitry of other logic tiles. In one embodiment, circuitry of the logic tiles is electrically disconnected from circuitry of other logic tiles (e.g., neighboring logic tiles) and/or circuitry external to the programmable/configurable logic circuitry during performance of a test sequence/process. Thus, a logic tile may be configured such that the interconnect network of that logic tile may be effectively disconnected from one or more (or all) interconnect network(s) of other logic tiles of the array. For example, where the logic tile is undergoing test, the circuitry of a logic tile may be configured to be electrically isolated from circuitry of other logic tile(s) which is/are connected thereto during normal or typical operation.

For example, in test a mode, the interconnect network (or circuitry associated with the interconnect network) of a logic tile may be electrically "disconnected" from the associated interconnects and circuitry of other logic tiles to assess the functionality of the interconnect network and/or circuitry associated with the interconnect network in isolation. In one embodiment, isolation circuitry may be enabled to disconnect or disable selected interconnects of one or more stages of the interconnect network from stages of one or more associated interconnect network of other logic tile(s) (e.g., adjacent logic tile(s)) of the programmable/configurable logic circuitry. For example, the output(s) of interconnects of one or more stages of the interconnect network of the logic tile under test or undergoing a test sequence that connect to an associated interconnect network of other logic tile(s) during normal operation are looped back into the interconnect network of such logic tile during performance of a test sequence/process of the logic tile (e.g., a test sequence pertaining to the interconnect network). Any other I/O (e.g., the I/Os in FIG. 11A) that connects between logic tiles in functional or normal mode maybe be disconnected and looped back in the same or a similar method to the interconnect network and/or the RBB I/O logic (as described herein). In this way, the impact of the operability or functionality of circuitry of other logic tile(s) (e.g., adjacent logic tile(s)) is managed, limited and/or eliminated relative to the testing of circuitry of the logic tile under test.

Notably, the isolation circuitry may be employed in the test mode and in a non-test mode (i.e., during normal operation of the programmable/configurable logic circuitry and/or FPGA) in order to disconnect certain circuitry (for example the interconnect network) from circuitry of other logic tiles to which is, under typically operating conditions, capable of being connected (i.e., it is capable of being connected when the logic tiles are programmed with normal/functional configuration data for a normal/functional configuration).

In one embodiment, control circuitry (which, for example, is disposed in/on the integrated circuit) program or configure circuitry of the logic tile(s) (I/O and/or circuitry associated with the switch interconnect network to program) in a test mode or test mode configuration. The control circuitry may also issue test mode commands—for example, one or more control signals to circuitry of the logic tiles to, for example, implement or enable (i) writing or loading of test mode configuration data to or into a plurality (or all) of the logic tiles in parallel or sequentially, and/or (ii) testing of circuitry in a plurality (or all) of the logic tiles in parallel or sequentially (e.g., using the test mode configuration data), and/or (iii) isolation circuitry (e.g., multiplexers) in one or more (or all) of the logic tiles to disconnect the logic tile from circuitry or conductors other logic tiles (e.g., circuitry of neighboring logic tile(s) that is connected during normal operation) and/or circuitry external to the logic tile array.

The control circuitry, in one embodiment, may also enable read-back operations. A read-back operation may be employed to verify a test mode configuration(s) and/or test data written to or loaded into such logic tile(s). In addition thereto, or in lieu thereof, the read-back operation may access the data of test results in order to assess the integrity, operability or functionality of the circuitry under test (e.g., in each of the logic tiles). In one embodiment, the read-back operation may employ the configuration port to read out data from the logic tiles (e.g., test mode configuration data previously written into circuitry (e.g., bitcells) in response to a test sequence. The control circuitry may program or configure one or more (or all) logic tiles during a test sequence—for example, when the integrated circuit is connected to IC test equipment.

Again, there are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

The terms "comprises," "comprising," "includes," "including," "have," and "having" or any other variation thereof, are intended to cover a non-exclusive inclusion, such that a process, method, circuit, article, integrated circuit or apparatus that includes/comprises a list of elements, components, steps (etc.) does not include only those elements, components, steps (etc.) but may include other elements, components, steps (etc.) not expressly listed or inherent to such process, method, circuit, article, integrated circuit or apparatus. Further, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "a" and "an" herein do not denote a limitation of quantity, but rather denote the presence of at least one of the referenced item. Further, the term "logic tile" means a design unit or block of a plurality of transistors (typically more than thousands), which, in this application, is capable of connecting to a plurality of neighboring "tiles", "cores" or "blocks". The term (i) "integrated circuit" means, among other things, a processor, controller, state machine, gate array, SoC, PGA and/or FPGA. The term (i) "integrated circuit" also means, for example, a processor, controller, state machine and SoC—including an embedded FPGA. For the avoidance of doubt, field programmable gate array or FPGA means both an FPGA and an embedded FPGA.

In addition, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like). The term "multiplexers" means multiplexers and/or switches.

Further, the term "initialization operation" means the power-up, start-up, initialization, re-initialization, configuration, and/or re-configuration operation of the logic tile, logic tile array and/or the integrated circuit including the logic tile array. The term data processing operations means operations including digital signal processing, encoding, decoding, encrypting, decrypting and/or other forms of data manipulation. Moreover, the terms "first," "second," and the like, herein do not denote any order, quantity, or importance, but rather are used to distinguish one element from another.

What is claimed is:

1. An integrated circuit comprising:
a field programmable gate array including:
a plurality of logic tiles, wherein, during operation of the field programmable gate array, each logic tile is configurable to connect with at least one other logic tile of the plurality of logic tiles, and wherein each logic tile of the plurality of logic tiles includes:
a normal operating mode,
a test mode,
an interconnect network including a plurality of multiplexers, wherein during operation of the field programmable gate array, the interconnect network of each logic tile is configurable to electrically connect with the interconnect network of at least one other adjacent logic tile of the plurality of logic tiles via one or more tile-to-tile interconnects in the normal operating mode, and
a plurality of bitcells to store data, wherein each bitcell includes a write enable control and at least one data input; and
control circuitry, electrically connected to each logic tile of the plurality of logic tiles, to enable concurrently writing configuration test data into the plurality of bitcells of each logic tile of the plurality of logic tiles in response to a test mode control signal of a test sequence wherein the configuration test data is written into the plurality of the bitcells of each logic tile of the plurality of logic tiles concurrently, during the test sequence, by enabling the write enable control of the plurality of the bitcells of each logic tile of the plurality of logic tiles and concurrently providing configuration test data to the at least one data input of each bit cell of the plurality of the bitcells of each logic tile of the plurality of logic tiles.

2. The integrated circuit of claim 1 further including:
test mode control circuitry, electrically connected to each logic tile of the plurality of logic tiles and configurable to issue the test mode control signal.

3. The integrated circuit of claim 1 further including:
test mode control circuitry, electrically connected to each logic tile of the plurality of logic tiles and configurable to issue a control signal wherein, in response, circuitry of each logic tile of the plurality of logic tiles undergoes the test sequence concurrently.

4. The integrated circuit of claim 1 wherein:
isolation circuitry, connected between the interconnect network of the associated logic tile and the interconnect network of each adjacent logic tile, configurable to electrically disconnect the interconnect network of each logic tile of the plurality of logic tiles from the interconnect network of each logic tile of the other logic tiles of the plurality of logic tiles.

5. The integrated circuit of claim 1 wherein:
the isolation circuitry includes one or more multiplexers, wherein each multiplexer of the isolation circuitry includes: (i) a first input connected to a tile-to-tile interconnect providing an input from the interconnect network of another logic tile of the plurality of logic tiles and (ii) a second input connected to a tile-to-tile interconnect providing an output from the interconnect network of the associated logic tile.

6. The integrated circuit of claim 5 further including:
test mode control circuitry, electrically connected to each logic tile of the plurality of logic tiles and configurable to concurrently issuing one or more control signals to the first isolation circuitry of each of the logic tiles of the plurality of logic tiles wherein, in response, each logic tile of the plurality of logic tiles is in the test mode.

7. The integrated circuit of claim 1 wherein:
the isolation circuitry includes one or more multiplexers, wherein each multiplexer of the isolation circuitry includes: (i) a first input connected to a tile-to-tile interconnect providing an input from the interconnect network of another logic tile of the plurality of logic tiles, (ii) a second input connected to a tile-to-tile interconnect providing an output from the interconnect network of the associated logic tile and (iii) an output connected to an input of a stage of the interconnect network of the associated logic tile.

8. An integrated circuit comprising:
a field programmable gate array including:
a plurality of logic tiles, wherein, during operation of the field programmable gate array, each logic tile is configurable to connect with at least one other logic tile of the plurality of logic tiles, and wherein each logic tile of the plurality of logic tiles includes:
a normal operating mode,
a test mode,
an interconnect network including a plurality of multiplexers, wherein during operation of the field programmable gate array, the interconnect network of each logic tile is configurable to electrically connect with the interconnect network of at least one other adjacent logic tile of the plurality of logic tiles via one or more tile-to-tile interconnects in the normal operating mode, and
a plurality of reconfigurable building block I/O logic, wherein each reconfiqurable building block I/O logic includes at least one data input; and
control circuitry, electrically connected to each logic tile of the plurality of logic tiles, to enable concurrently writing configuration test data into the plurality of reconfigurable building block I/O logic of each logic tile of the plurality of logic tiles in response to a test mode control signal of a test sequence wherein the configuration test data is written into the plurality of reconfigurable building block I/O logic of each logic tile of the plurality of logic tiles concurrently, during the test sequence, by concurrently providing configuration test data to the at least one data input of the plurality of the reconfiqurable building block I/O logic of each logic tile of the plurality of logic tiles.

9. The integrated circuit of claim 8 further including:
isolation circuitry, located at an input to each of the plurality of reconfigurable building block I/O logic of the logic tile, configurable to responsively disconnect the input to the reconfigurable building block I/O logic of the logic tile from circuitry external to the logic tile in the test mode to thereby electrically disconnect the plurality of reconfigurable building block I/O logic from circuitry external to the logic tile in the test mode.

10. The integrated circuit of claim 9 wherein:
the isolation circuitry includes one or more multiplexers, wherein each multiplexer of the isolation circuitry includes: (i) a first input connected to circuitry external to associated logic tile and (ii) a second input connected to an output from the associated reconfigurable building block I/O logic of the associated logic tile.

11. The integrated circuit of claim 10 wherein:
each multiplexer of the second isolation circuitry, in the test mode, is capable of connecting an output from the associated reconfigurable building block I/O logic of the associated logic tile to its output.

12. The integrated circuit of claim 11 further including:
test mode control circuitry, configurable to concurrently issue one or more control signals to the isolation circuitry of each of the logic tiles of the plurality of logic tiles wherein, in response, each logic tile is in the test mode.

13. A method of testing an integrated circuit comprising a field programmable gate array including a plurality of logic tiles, wherein each logic tile includes (a) a plurality of bitcells, each bitcell having a write enable control and at least one data input, (b) a plurality of reconfigurable building block I/O logic, each reconfiqurable building block I/O logic having at least one data input, and (c) an interconnect network having a plurality of multiplexers, wherein during a normal operating mode of the field programmable gate array, the interconnect network of each logic tile is configurable to electrically connect with the interconnect network of at least one other logic tile of the plurality of logic tiles via one or more tile-to-tile interconnects, the method comprising:
providing a test mode command to each logic tile of the plurality of logic tiles to configure each logic tile of the plurality of logic tiles for test, wherein in response, the field programmable gate array is in a test mode;

concurrently writing first configuration test data into the plurality of bitcells of each logic tile of the plurality of logic tiles, when the field programmable gate array is in the test mode, by:
enabling the write enable control of the plurality of the bitcells of each logic tile of the plurality of logic tiles and concurrently providing first configuration test data to the at least one data input of each bitcell of the plurality of the bitcells of each logic tile of the plurality of logic tiles;
after concurrently writing first configuration test data into the plurality of bitcells of each logic tile of the plurality of logic tiles of each logic tile of the plurality of logic tiles, concurrently performing a first test sequence on each logic tile of the plurality of logic tiles when the field programmable gate array is in the test mode;
concurrently writing second configuration test data into the plurality of the reconfiqurable building block I/O logic of each logic tile of the plurality of logic tiles, when the field programmable gate array is in the test mode, by:
concurrently providing second configuration test data to the at least one data input of the plurality of reconfiqurable building block I/O logic of each logic tile of the plurality of logic tiles; and
after concurrently writing second configuration test data into the plurality of reconfigurable building block I/O logic of each logic tile of the plurality of logic tiles of each logic tile of the plurality of logic tiles, concurrently performing a second test sequence on each logic tile of the plurality of logic tiles when the field programmable gate array is in the test mode.

14. The method of claim 13 wherein:
providing a test mode command to each logic tile of the plurality of logic tiles includes concurrently providing the test mode command to each logic tile of the plurality of logic tiles to configure each logic tile of the plurality of logic tiles for test.

15. The method of claim 13 further including:
reading-back test data from the plurality of logic tiles, (i) when the field programmable gate array is in the test mode and (ii) before performing the test sequence, to verify the first configuration test data concurrently written into the plurality of bitcells of each logic tile of the plurality of logic tiles.

16. The method of claim 13 further including:
electrically isolating each logic tile from the other logic tiles of the plurality of logic tiles when the field programmable gate array is in the test mode.

17. The method of claim 16 wherein:
electrically isolating each logic tile from the other logic tiles of the plurality of logic tiles when the field programmable gate array is in the test mode includes electrically isolating the interconnect network of each logic tile from the interconnect networks of the other logic tiles of the plurality of logic tiles.

18. The method of claim 16 wherein:
electrically isolating each logic tile from each of the other logic tiles of the plurality of logic tiles when the field programmable gate array is in the test mode includes electrically isolating the plurality of reconfigurable building block I/O logic of each logic tile from (i) circuitry of other logic tiles of the plurality of logic tiles and/or (ii) circuitry external to each logic tile of the plurality of logic tiles.

19. The method of claim 16 wherein:
electrically isolating each logic tile from each of the other logic tiles of the plurality of logic tiles when the field programmable gate array is in the test mode includes electrically isolating:
the interconnect network of each logic tile from the interconnect network of each of the other logic tiles of the plurality of logic tiles, and
the plurality of reconfigurable building block I/O logic of each logic tile from (i) circuitry of other logic tiles of the plurality of logic tiles and/or (ii) circuitry external to each logic tile of the plurality of logic tiles.

20. The method of claim 13 further including:
reading-back test data from the plurality of logic tiles, (i) when the field programmable gate array is in the test mode and (ii) before performing the test sequence, to verify the second configuration test data concurrently written into plurality of reconfigurable building block I/O logic of each logic tile of the plurality of logic tiles.

21. An integrated circuit comprising:
a field programmable gate array including:
a plurality of logic tiles, wherein, during operation of the field programmable gate array, each logic tile is configurable to connect with at least one other logic tile of the plurality of logic tiles, and wherein each logic tile of the plurality of logic tiles includes:
a normal operating mode;
a test mode;
an interconnect network including a plurality of multiplexers, wherein during operation of the field programmable gate array, the interconnect network of each logic tile is configurable to electrically connect with the interconnect network of at least one other adjacent logic tile of the plurality of logic tiles via one or more tile-to-tile interconnects in the normal operating mode;
a plurality of reconfigurable building block I/O logic; and
isolation circuitry, located at an input to each reconfigurable building block I/O logic of the plurality of reconfigurable building block I/O logic of the logic tile, configurable to responsively disconnect the input to the reconfigurable building block I/O logic of the logic tile from circuitry external to the logic tile in the test mode to thereby electrically disconnect the reconfigurable building block I/O logic from circuitry external to the logic tile in the test mode wherein:
the isolation circuitry includes one or more multiplexers, wherein each multiplexer of the isolation circuitry includes: (i) a first input connected to circuitry external to associated logic tile and (ii) a second input connected to an output from the associated reconfigurable building block I/O logic of the associated logic tile.

22. The integrated circuit of claim 21 wherein:
each multiplexer of the isolation circuitry, in the test mode, is capable of connecting an output from the associated reconfigurable building block I/O logic of the associated logic tile to its output.

23. The integrated circuit of claim 21 further including:
test mode control circuitry wherein the isolation circuitry is responsive to one or more control signals from the test mode control circuitry.

24. The integrated circuit of claim 23 wherein:
the test mode control circuitry is capable of concurrently issuing one or more control signals to the isolation circuitry of each of the logic tiles of the plurality of logic tiles wherein, in response, each logic tile is in the test mode.

\* \* \* \* \*